United States Patent
Okita

(10) Patent No.: US 7,746,446 B2
(45) Date of Patent: Jun. 29, 2010

(54) ALIGNMENT CONDITION DETERMINATION METHOD AND APPARATUS OF THE SAME, AND EXPOSURE METHOD AND APPARATUS OF THE SAME

(75) Inventor: Shinichi Okita, Tokyo (JP)

(73) Assignee: Nikon Corporation, Tokyo (JP)

( * ) Notice: Subject to any disclaimer, the term of this patent is extended or adjusted under 35 U.S.C. 154(b) by 611 days.

(21) Appl. No.: 10/594,836

(22) PCT Filed: Mar. 29, 2005

(86) PCT No.: PCT/JP2005/005958

§ 371 (c)(1),
(2), (4) Date: Jul. 18, 2007

(87) PCT Pub. No.: WO2005/096353

PCT Pub. Date: Oct. 13, 2005

(65) Prior Publication Data

US 2008/0094642 A1  Apr. 24, 2008

(51) Int. Cl.
G03B 27/42 (2006.01)
G03B 27/58 (2006.01)
G03B 27/32 (2006.01)
G01B 11/00 (2006.01)

(52) U.S. Cl. .............................. 355/53; 355/72; 355/77; 356/400

(58) Field of Classification Search ................... 355/53, 355/55, 59, 61, 77, 52, 72–74; 356/399–401; 250/548

See application file for complete search history.

(56) References Cited

U.S. PATENT DOCUMENTS

| 5,525,808 | A | 6/1996 | Irie et al. |
| 6,416,912 | B1 * | 7/2002 | Kobayashi et al. ............. 430/22 |
| 2003/0071980 | A1 | 4/2003 | Ina et al. |
| 2003/0202182 | A1 * | 10/2003 | Matsumoto et al. ......... 356/401 |
| 2003/0204282 | A1 * | 10/2003 | Oishi et al. ................. 700/108 |
| 2003/0204348 | A1 * | 10/2003 | Suzuki et al. ................. 702/83 |
| 2004/0058540 | A1 * | 3/2004 | Matsumoto et al. ......... 438/689 |
| 2004/0223157 | A1 * | 11/2004 | Nakajima ................... 356/401 |
| 2004/0257573 | A1 * | 12/2004 | Matsumoto ................. 356/401 |
| 2005/0254030 | A1 * | 11/2005 | Tolsma et al. ................. 355/53 |

FOREIGN PATENT DOCUMENTS

| JP | A 4-32219 | 2/1992 |
| JP | A 5-335212 | 12/1993 |
| JP | A 2000-173921 | 6/2000 |
| JP | A 2002-237451 | 8/2002 |
| JP | A 2003-197517 | 7/2003 |
| JP | A 2004-31929 | 1/2004 |

* cited by examiner

Primary Examiner—Peter B Kim
Assistant Examiner—Christina Riddle
(74) Attorney, Agent, or Firm—Oliff & Berridge

(57) ABSTRACT

Alignment parameters determination method with less overlay error after exposure without tremendous expending time and cost is provided. Provision is made of a fetching unit performing position measurement and statistical processing to obtain reference computation results. Another fetching unit obtains reference processing results by positioning and exposing shots at a predetermined exposure apparatus based on the reference computation results, then measuring overlay error for the shots. Another fetching unit changes at least parts of the predetermined alignment parameters and performs position measurement and statistical processing to obtain comparative computation results. A controller 650 calculates estimated overlay error when assuming positioning and exposure of shots at a predetermined exposure apparatus based on the comparative computation results using the reference computation results, comparative computation results, and reference processing results.

14 Claims, 11 Drawing Sheets

ALIGNMENT CONDITION DETERMINATION METHOD AND APPARATUS OF THE SAME, AND EXPOSURE METHOD AND APPARATUS OF THE SAME

TECHNICAL FIELD

The present invention relates to a method and apparatus for determination of alignment parameters suitable for use in a case when successively positioning shot areas on a wafer at exposure positions based on array coordinates calculated by statistical processing in an exposure method or exposure system successively transferring for example patterns of a mask or reticle to shot areas on a substrate.

BACKGROUND ART

A semiconductor device, liquid crystal display element, image capturing device (CCD: Charge Coupled Device etc.), thin film magnetic head, and various other types of devices are mostly produced by using an exposure apparatus to transfer by exposure multiple layers of patterns overlaid on a substrate. For this reason, when transferring by exposure the second layer and later layers of patterns on a substrate, the shot areas already formed with patterns on the substrate and the pattern images of the mask must be aligned, that is, the substrate and reticle must be aligned. The substrate on which the first layer of patterns has been transferred by exposure is formed with a plurality of shot areas (chip patterns) provided with positioning marks called alignment marks. These shot areas are regularly arranged based on array coordinates set in advance on the substrate.

However, even if stepping a substrate based on the designed array coordinate values of a plurality of shot areas (shot array) on a substrate, the substrate will not always be accurately positioned due to the four factors (six error parameters) of the (a) residual rotational error $\Theta$ of the substrate, (b) orthogonality error $\Omega$ of the stage coordinate system (or shot array), (c) scalings $\Gamma x$, $\Gamma y$ of the substrate, (d) offsets (parallel movements) Ox, Oy of the substrate (center position).

Therefore, in the past, an enhanced global alignment (EGA) system has been used which statistically processed the measurement values obtained from a plurality of shot areas (sample shots) selected from a substrate to find the array of all of the shot areas on the substrate and positioned the shot areas in accordance with this array.

An EGA system uses the least square method to determine a conversion matrix to minimize the average error between array coordinate values obtained by actual measurement of sample shots and calculated array coordinate values obtained by entering designed array coordinate values of the shot areas into a predetermined model equation, calculates the calculated array coordinate values of positions for actual positioning based on this determined conversion matrix and the designed array coordinate values, and positions the shot areas of the substrate based on the calculated coordinate values.

Further, in addition to array error of shot areas on a substrate, shot areas suffer from overlay error in the shot areas due to the three factors of (a) residual rotational error $\theta$ of the shot area, (b) orthogonality error $\omega$ in the shot area, and (c) scalings $\gamma x$, $\gamma y$ of the shot area.

Therefore, an EGA system is also known which uses a conversion matrix using a total of 10 error parameters including these three amounts of error (four error parameters) so as to find the array coordinate values for each shot area and the amounts of correction for overlay error for each shot area.

When employing this type of EGA system for alignment, which sample shots (number and positions) are measured or which measuring device is used when there are a plurality of types of measuring devices (detectors) has a great effect on the computation results, so these are preferably optimized. As such optimization technology, as disclosed in Japanese Patent No. 3313543, it is known to successively change the positions of the marks to be measured (sample shots) and the detector for EGA computation and select the combination of the mark positions and detector giving the smallest residual error component (random component) according to the plurality of EGA computation results as the optimal alignment parameters.

However, optimization of such alignment parameters is designed to enable circuit patterns actually transferred by exposure to a substrate to be overlaid over previously formed circuit patterns with a high precision.

However, in the conventional art for optimization of the alignment parameters, the alignment parameters giving the smallest residual error component from the design values in the processing are selected as the optimal alignment parameters, so the overlay of the circuit patterns actually transferred by exposure on the substrate is not necessarily optimized. Even if the residual error component in the computation is the smallest, sometimes the overlay of circuit patterns is actually not sufficient. Even if the residual error component is not the smallest, there is a possibility of alignment parameters with higher precision of overlay of the circuit patterns.

Here, regarding the combination of the various types of alignment parameters, it may be considered to actually transfer by exposure and develop circuit patterns on a substrate, then measure the results of overlay of the circuit patterns (overlay error) and determine the best alignment parameters of the overlay results as the optimal alignment parameters. However, there are a huge number of combinations of alignment parameters. Measuring the overlay for all of these would require tremendous time and cost etc., so employing this technique is de facto difficult.

DISCLOSURE OF INVENTION

Therefore, an object of the present invention is to provide a method and apparatus able to reduce the error (overlay error) after exposure or other processing without expending tremendous time and cost. Further, another object of the present invention is to provide a method and apparatus able to produce high precision high quality microdevices etc. with a high throughput.

According to a first aspect of the present invention, there is provided a method for determining the optimal alignment parameters for positioning each of a plurality of processing areas ($ES_1$ to $ES_M$) arrayed on an object (W) with respect to a predetermined processing position, which method for determining the alignment parameters comprises a first step (step 1) of performing position measurement for any sample points set in each processing area under predetermined alignment parameters through opto-electric detection and statistical processing based on measured positions and design positions of the sample points to obtain reference computation results, a second step (steps 11 and 12) of positioning and processing each processing are at the predetermined processing position based on the reference computation results, then measuring a processing error of the processing area to obtain reference processing results, a third step (step 8) of changing at least part of the predetermined alignment parameters and performing position measurement of any sample points set in each processing areas and statistical processing based on the measured positions and design positions of the sample points to obtain comparative computation results, and a fourth step (step 13) of calculating the processing error for each processing area, estimated when assuming the positioning and processing the processing area at the predetermined processing position based on the comparative computation results, using the reference computation results, the comparative computation results, and the reference computation results.

The present invention calculates the processing error estimated when assuming positioning and processing of a processing area at the predetermined processing position based on the comparative computation results using the reference computation results, comparative computation results, and the reference processing results and can estimate processing error close to the actual processing error. Therefore, it is possible to determine the optimal alignment parameters from the relative magnitude of the thus calculated processing error and use the thus determined alignment parameters for processing so as to reduce the processing error. Further, the processing error need only be actually measured once in order to obtain the reference processing result. There is no need to actually measure the processing error for each of the combinations of the various types of alignment parameters, so it is possible to obtain the optimal alignment parameters giving small processing error without expending tremendous time and cost etc.

The method of determination of the alignment parameters according to a first aspect of the present invention may further comprise, in the third step, changing the alignment parameters in a plurality of ways to obtain a plurality of comparative computation results, in the fourth step, converting the reference processing results based on the differences between the reference computation results and the comparative computation results to calculate a plurality of estimated processing errors, and further have a fifth step of comparing the plurality of estimated processing errors calculated at the fourth step and the reference processing result to obtain a comparison results and determining the alignment parameters based on the comparison results. In this case, the method may, in the fifth step, determine the optimal alignment parameters based on at least one of the average value and standard error of the processing error for each processing area according to the reference processing result or the estimated processing error.

The method of determination of the alignment parameters according to the first aspect of the present invention may, in the third step, change variable first alignment parameters of any sample point among the alignment parameters without requiring repeat opto-electric detection so as to calculate the comparative computation results. In this case, the first alignment parameters may include at least one of the combination used in sample points opto-electrically detected at the first step, the processing parameters of the signal waveforms obtained by the opto-electric detection at the first step, the statistical processing model used at the time of the statistical processing, and the amounts of correction to be added to the measurement positions of the sample points opto-electrically detected at the first step. The greater the number of the comparative computation results, the higher the possibility of obtaining more optimal alignment parameters, but increasing the actual number of measurements of the sample points is not preferable since it invites an increase in the overall measurement time. In this aspect, by changing the variable first alignment parameters among the alignment parameters for any sample point without requiring repeat opto-electric detection, comparative computation results are calculated, so it is possible to raise the possibility of obtaining more optimal alignment parameters without increasing the number of measurements.

The method of determination of the alignment parameters according to the first aspect of the present invention may, in the third step, change second alignment parameters, among the alignment parameters, requiring repeat opto-electric detection of the sample points separate from the opto-electric detection at the first step so as to calculate the comparative computation results. In this case, the second alignment parameters may include the type (including cases of different shapes), number, and layout of the sample points, illumination parameters for illuminating the sample points at the time of the opto-electric detection, and the state of focus at the time of the opto-electric detection.

In the method of determination of the alignment parameters according to the first aspect of the present invention, the third step may include a sixth step (step 8) of using signal waveforms obtained by the opto-electric detection at the first step to change at least part of the predetermined alignment parameters and obtain a plurality of the comparative computation results and a seventh step (steps 9 and 10) of comparing the plurality of comparative computation results obtained at the sixth step and the reference computation results and selecting candidates of the comparative computation results to be used in the fourth step based on the comparison results. In this case, the method may, in the seventh step, select the candidates based on residual error components of the comparative computation results. Performing the fourth step for all of the obtained comparative computation results is not preferable when the number would be particularly enormous. On the other hand, when for example the residual error components of the comparative computation results are considerably large compared with the reference computation results, not much of an improvement in the processing precision can be expected when processing by the alignment parameters of the comparative computation results. In this aspect, these points are considered and the candidates of the alignment parameters are narrowed down to a certain extent, then the optimal alignment parameters are determined.

According to a second aspect of the present invention, there is provided an exposure method for exposing and transferring patterns of a mask (R) on a plurality of shot areas (ES1 to $ES_M$) arrayed on a substrate (W), the exposure method performs position measurement for sample points set in each shot area serving as a processing area by opto-electric detection using optimal alignment parameters determined by the method of determination of the alignment parameters according to the first aspect of the present invention and statistical processing based on measured positions and design positions of the sample points and successively positions the shot areas with respect to an exposure apparatus serving as the predetermined processing position and exposes each shot area based on the computation results. The positioning is performed using sufficiently optimized alignment parameters, so it is possible to produce high quality, high precision devices etc.

According to a third aspect of the present invention, there is provided an apparatus for determining optimal alignment parameters for positioning a plurality of processing areas ($ES_1$ to $ES_M$) arrayed on an object (W) with respect to a predetermined processing position, the apparatus for determining alignment parameters having a reference computation result fetching means (6, 610) for performing position measurement for any sample points set in each the processing area under predetermined alignment parameters via opto-electric detection and statistical processing based on measured positions and design positions of the sample points to obtain reference computation results, a reference processing result fetching means (400, 640) for measuring the processing error for each processing area to obtain reference processing results after positioning and processing the processing area at the predetermined processing position based on the reference computation results, a comparative computation result fetching means (6, 620, 650) for changing at least part of the predetermined alignment parameters and performing position measurement of any sample points set for each the processing area and statistical processing based on measured positions and design positions of the sample points to obtain comparative computation results, and a processing error calculating means (650) for calculating the processing error for the processing areas estimated when assuming positioning and processing the processing areas at the predetermined processing position based on the comparative computation results using the reference computation results, the comparative computation results, and the reference processing results.

In this case, the comparative computation result fetching means may change the alignment parameters in a plurality of ways to obtain a plurality of the comparative computation results, the processing error calculating means may convert the reference processing results and calculate the estimated processing error based on the differences between the reference computation results and the comparative computation results, and provision may be further made of a parameter determining means (650) for comparing the plurality of estimated processing error calculated by the processing error calculating means and the reference processing result and determining the alignment parameters based on the comparison results. Actions and effects similar to the method of determination of the optimal alignment parameters of the first aspect of the present invention can be achieved.

According to a fourth aspect of the present invention, there is provided an exposure apparatus for transferring by exposure patterns of a mask (R) on a plurality of shot areas (ES1 to ESM) arrayed on a substrate (W), the exposure apparatus (200) provided with an apparatus for determining alignment parameters (600) according to the third aspect of the present invention, performing position measurement for any sample points set for each shot area serving as a processing area by opto-electric detection using optimal alignment parameters determined by the apparatus for determination of the alignment parameters and statistical processing based on measured positions and design positions of the sample points, and successively positioning the shot areas with respect to the exposure apparatus serving as the predetermined processing position and exposing each shot area based on the obtained computation results. Actions and effects similar to the exposure method of the second aspect of the present invention can be achieved.

According to the present invention, there is the effect that it is possible to reduce the error after exposure or other processing without expending tremendous time and cost. Further, there is the effect that it is possible to produce high precision high quality microdevices etc. with a high throughput.

BEST MODE FOR WORKING THE INVENTION

Figure 1A:
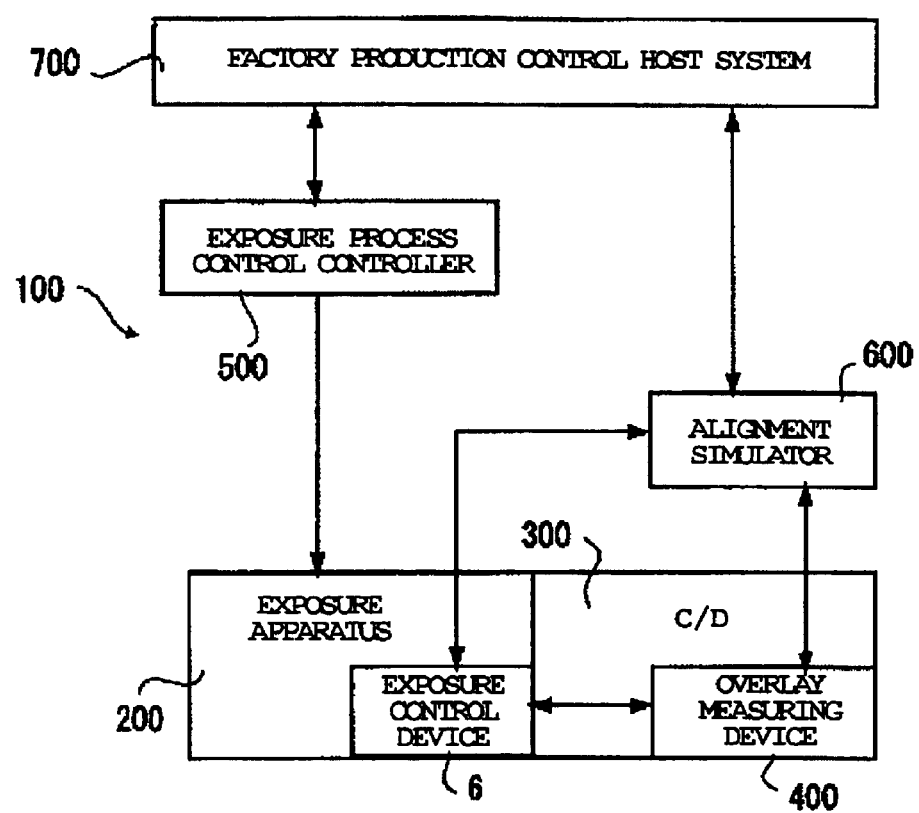
FIG. 1A is a block diagram of the overall configuration of an exposure system according to an embodiment of the present invention.

Below, an embodiment of the present invention will be explained in detail with reference to the drawings.

[Exposure System]

First, the overall configuration of an exposure system according to an embodiment will be explained with reference to FIG. 1A.

This exposure system 100 processes semiconductor wafers, glass plates, or other substrates and is installed in a substrate processing factory producing microdevices or other devices. As shown in the figure, it is provided with an exposure apparatus 200, a coater/developer (C/D) 300 arranged adjoining the exposure apparatus 200, and an overlay measuring device 400 arranged adjoining the coater/developer 300. In the figure, for convenience in the illustration, the exposure apparatus 200 and the coater/developer 300 including the overlay measuring device 400 are illustrated as a single substrate processing apparatus combining these, but in fact a plurality of substrate processing apparatuses are provided. Each substrate processing apparatus performs a coating process of coating a substrate with a photoresist or other photosensitizer, an exposure process of projecting and exposing images of patterns of a mask or reticle on a substrate coated with the photosensitizer, and a development process of developing a substrate finished being exposed.

Further, the exposure system 100 is also provided with an exposure process control controller 500 for centrally controlling the exposure process performed by each exposure apparatus 200, an alignment simulator 600 to which the present invention is applied (hereinafter simply referred to as a "simulator 600"), and a factory production control host system 700.

Among the apparatuses forming this exposure system 100, at least the substrate processing apparatuses (200, 300) are installed in a clean room controlled in air temperature and humidity. Further, the apparatuses are connected to a LAN (Local Area Network) or other network or dedicated line (wired or wireless) laid in the substrate processing factory and can suitably transfer data between them.

In each substrate processing apparatus, the exposure apparatus 200 and coater/developer 300 are connected with each other in line. The "in line connection" means connection between the apparatuses and between processing units in the apparatuses through a robot arm, slider, or other conveyor apparatus for automatically conveying a substrate.

Figure 1B:
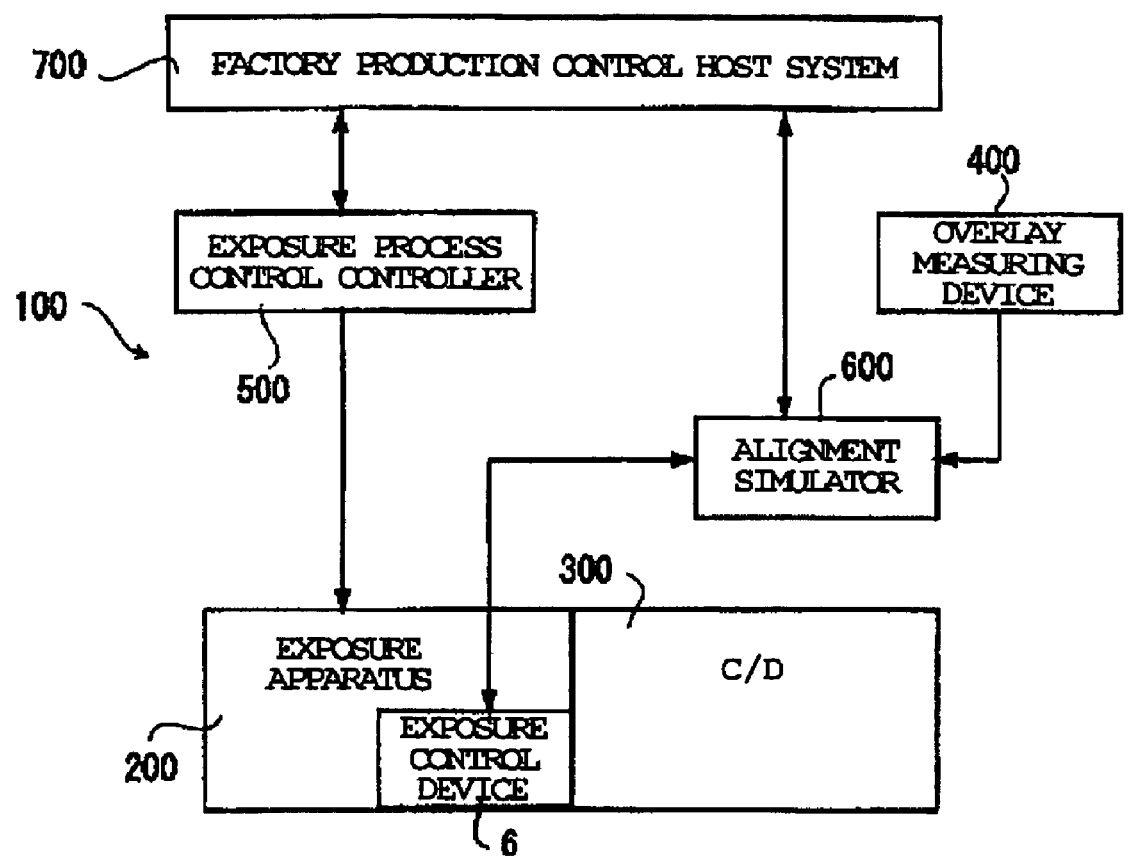
FIG. 1B is a block diagram of the overall configuration of another exposure system according to the present invention.

The system of FIG. 1B, compared with that shown in FIG. 1A, differs in the point that the overlay measuring device 400 is not provided inside the coater/developer 300 but is a stand alone type overlay measuring device. The present invention can also be applied to any type of system of FIG. 1A or FIG. 1B. Below, the explanation will be continued focusing on FIG. 1A.

[Exposure Apparatus]

The configuration of the exposure apparatus 200 provided in each substrate processing apparatus will be explained with reference to FIG. 2. This exposure apparatus 200 may of course be a step-and-scan type (scan exposure type) exposure apparatus, but here, as an example, a step-and-repeat type exposure apparatus will be explained.

Note that in the following explanation, an XYZ orthogonal coordinate system shown in FIG. 2 will be set and this XYZ orthogonal coordinate system will be referred to for explaining the positional relationships of the different members. In the XYZ orthogonal coordinate system, the X-axis and Z-axis are set to become parallel to the paper surface, while the Y-axis is set to a direction vertical to the paper surface. In the XYZ coordinate system in the figure, actually the XY plane is set to a plane parallel to the horizontal plane, while the Z-axis is set to a vertical upward direction.

This exposure apparatus 200 is provided with an illumination optical system 1 comprised of an ArF excimer laser (wavelength 193 nm) or other light source and guiding exposure light emitted from the light source to a reticle R. The exposure light EL emitted from the light source passes through the illumination optical system 1, is guided to the reticle R arranged on an object plane of a projection optical system PL, and illuminates the reticle R substantially evenly. The reticle R is held on a reticle stage 3. The reticle stage 3 is supported to be able to move and finely rotate in a 2D plane on a base 4. The exposure control apparatus 6 controlling the operation of the system as a whole controls the operation of the reticle stage 3 through a drive apparatus 5 on the base 4.

A light beam passing through the reticle R is guided through the projection optical system PL to the wafer W, whereby pattern images of the reticle R are projected on the wafer W arranged on the image plane of the projection optical system PL. The projection optical system PL projects pattern images of the reticle R by a predetermined projection power a on the wafer W, for example, a double telecentric optical system. The projection power α of the projection optical system PL is a for example ¼ or ⅕ reduction system.

The wafer W is placed via a wafer holder 9 on a wafer stage 10. The wafer stage 10 is comprised of an XY stage for positioning a wafer W two-dimensionally in a plane vertical to the optical axis AX of the projection optical system PL, a Z-stage for positioning a wafer W in a direction parallel to the optical axis AX of the projection optical system PL (Z-direction), a stage for finely rotating the wafer W about the X-axis, Y-axis, or Z-axis, etc.

The wafer stage 10 has a moving mirror 11 fixed to one end of its top surface. A laser interferometer system 12 is provided facing the moving mirror 11. Further, while the illustration is simplified in FIG. 2, the moving mirror 11 is comprised of a flat mirror having a reflection surface vertical to the X-axis and a flat mirror having a reflection surface vertical to the Y-axis. Further, the laser interferometer system 12 is comprised of two X-axis laser interferometers emitting laser beams along the X-axis to the moving mirror 11 and two Y-axis laser interferometers emitting laser beams along the Y-axis to the moving mirror 11. One X-axis laser interferometer and one Y-axis laser interferometer measure the X-coordinate and Y-coordinate of the wafer stage 10.

Further, the difference in measured values of the two X-axis laser interferometers is used to measure the rotational angle of the wafer stage 10 about the optical axis AX of the projection optical system PL. The information of the X-coordinate, Y-coordinate, and rotational angle measured by the laser interferometer system 12 is supplied to the coordinate calculation circuit 12a and exposure control apparatus 6. The exposure control apparatus 6 monitors the supplied coordinates and controls the positioning operation of the wafer stage 10 through a drive apparatus 13. Further, while not shown in FIG. 2, the reticle side is also provided with an interferometer system exactly the same as the wafer side.

Figure 2:
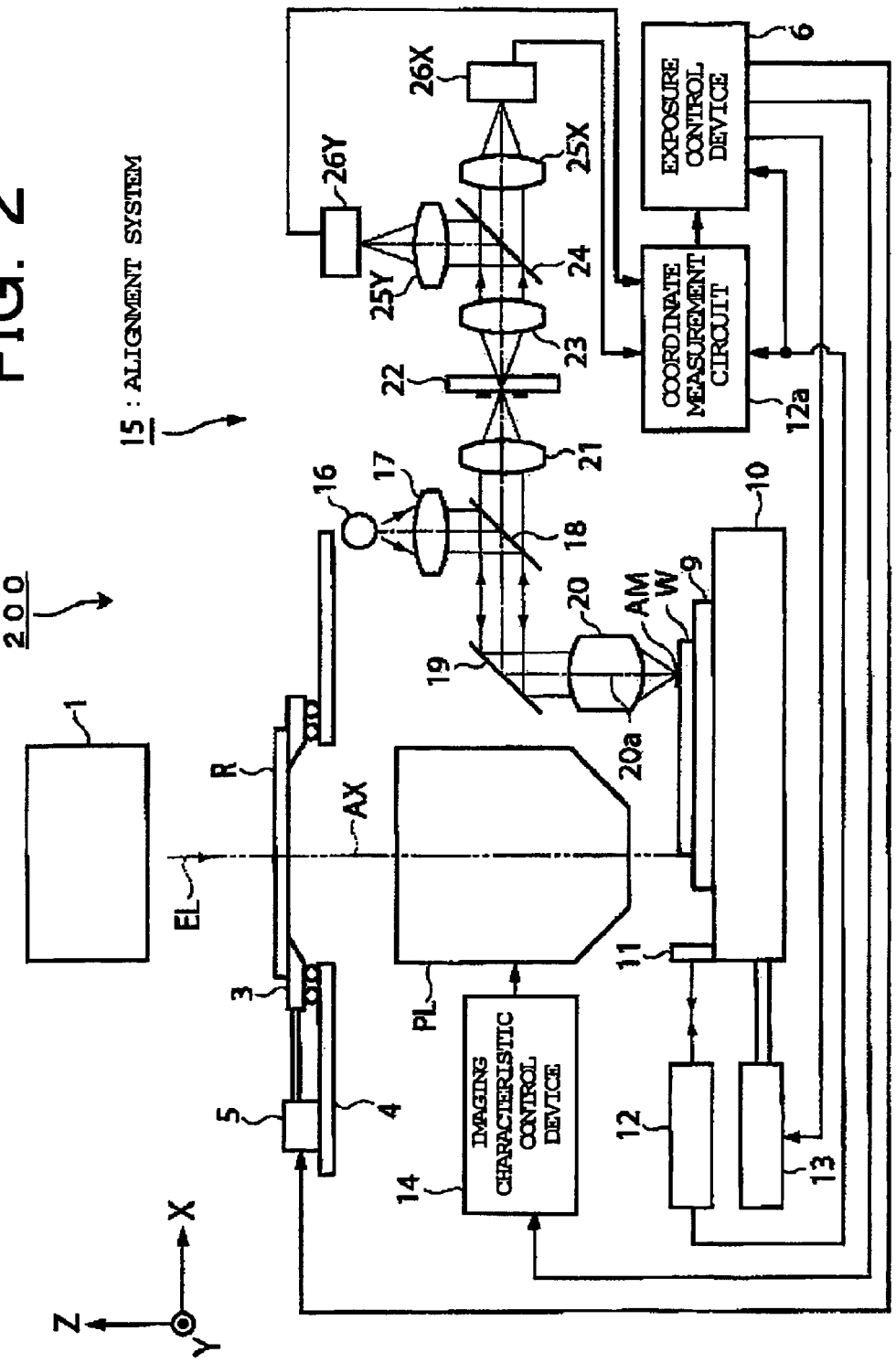
FIG. 2 is a view of the general configuration of an exposure apparatus provided in an exposure system according to an embodiment of the present invention.

The projection optical system PL provided in the exposure apparatus 200 of the embodiment shown in FIG. 2 is provided with an imaging characteristic control apparatus 14. This imaging characteristic control apparatus 14 for example adjusts the distances between predetermined lenses in the lenses forming the projection optical system PL or adjusts the air pressures in the lens chambers between predetermined lenses so as to adjust the projection power, aberration, and other optical characteristics of the projection optical system PL. The operation of the imaging characteristic control apparatus 14 is also controlled by the exposure control apparatus 6.

Further, an off-axis type alignment system 15 is arranged at the side of the projection optical system PL. This alignment system 15 is for example provided with a halogen lamp or other light source 16 emitting a broad band wavelength of light. Illumination light emitted from the light source 16 is emitted through a collimeter lens 17, beam splitter 18, mirror 19, and object lens 20 on to a measurement point formed on the wafer W, that is, an alignment mark AM. The distance between the optical axis 20a of the object lens 20 and the optical axis AX of the projection optical system PL, that is the baseline amount, is measured in advance with a high precision. The light reflected from an alignment mark AM is emitted through the object lens 20, mirror 19, beam splitter 18, and condensing lens 21 on to an indicator plate 22, whereby an image of the alignment mark AM is formed on the indicator plate 22.

Light passing through the indicator plate 22 passes through a first relay lens 23 and it heads toward a beam splitter 24. The light passing through the beam splitter 24 is focused by an X-axis second relay lens 25X on the imaging surface of an X-axis image capturing device 26X comprised of a 2D CCD. The light reflected at the beam splitter 24 is focused by a Y-axis second relay lens 25Y on the imaging surface of a Y-axis image capturing device 26Y comprised of a 2D CCD. On the imaging surfaces of the image capturing devices 26X, 26Y, images of the alignment marks AM and images of the indicator marks of the indicator plate 22 are formed superposed. The image signals of the image capturing devices 26X, 26Y are supplied together to the coordinate calculation circuit 12a.

Figure 3A:
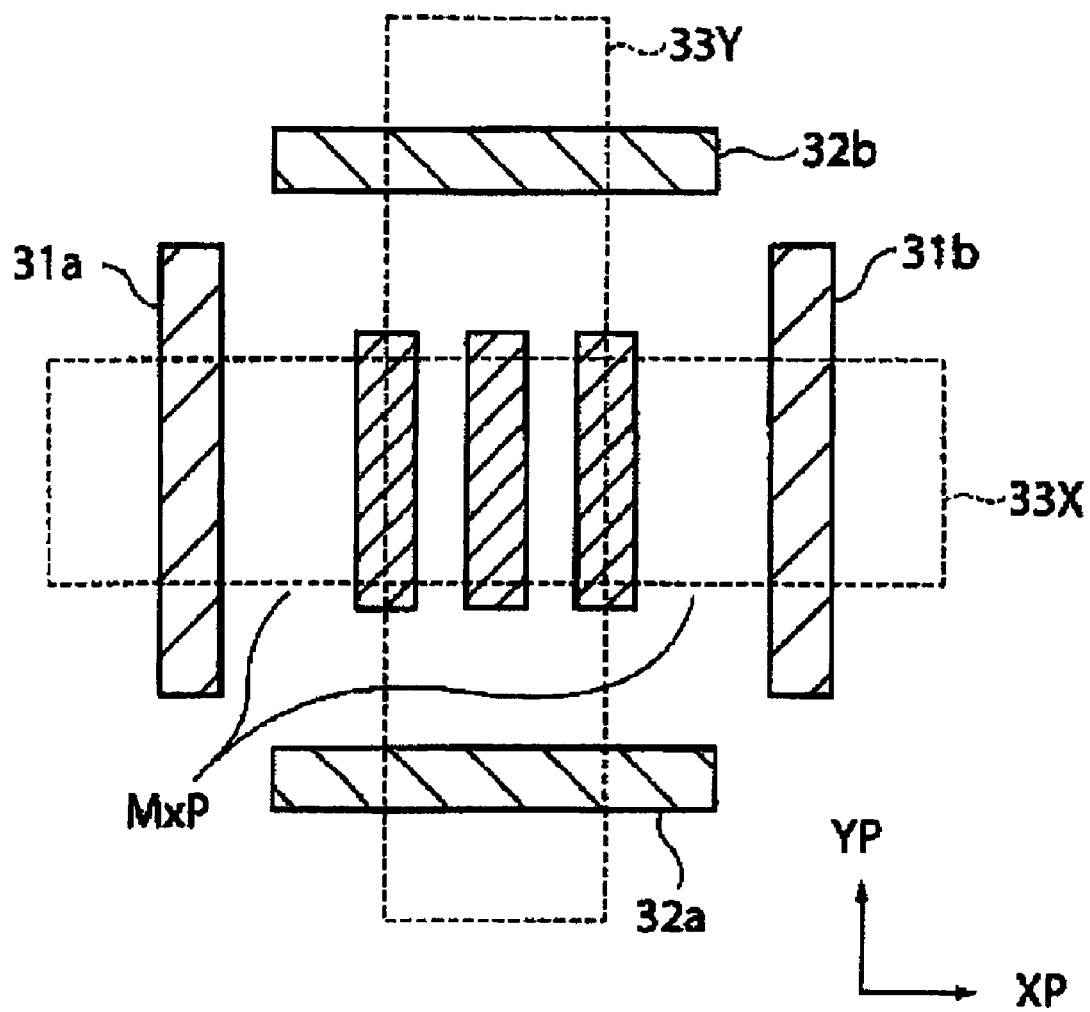
FIG. 3A is a view of patterns and wafer marks on an indicator plate of FIG. 2.
Figure 3B:
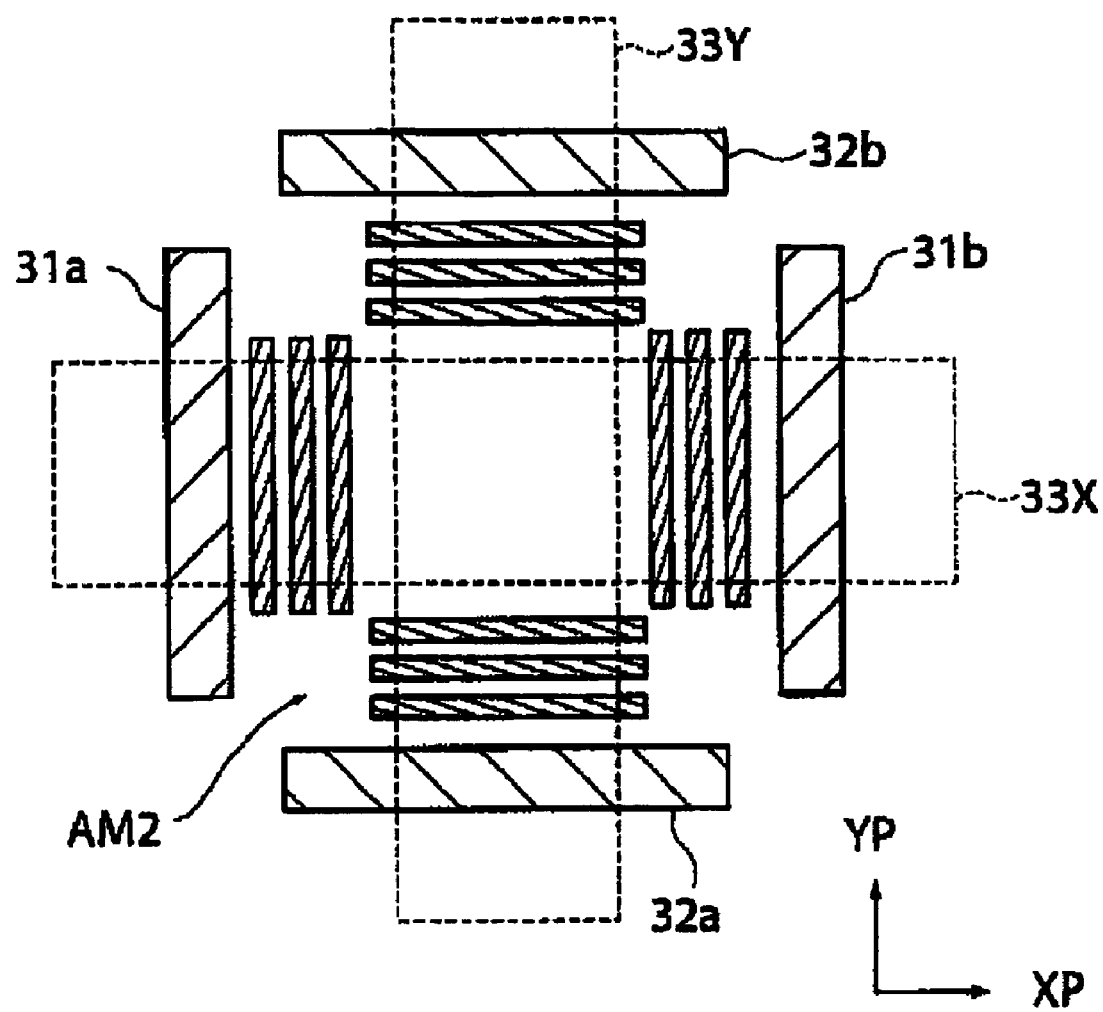
FIG. 3B is another view of the relationship of wafer marks and indicator marks.

FIG. 3A is a view of the patterns on the indicator plate 22 of FIG. 2. In FIG. 3A, images MxP of wafer marks Mx comprised of three straight patterns are formed at the center. The pitch direction of the images MxP, that is, the XP direction, and the long direction of the images MxP, that is, the YP direction, serve also as the X-direction and Y-direction of the stage coordinate system of the wafer stage 10 of FIG. 2. Further, the wafer mark images MxP are straddled in the XP direction by two indicator marks 31a, 31b, while the wafer mark images MxP are straddled in the YP direction by two indicator marks 32a, 32b. Further, the measurement points formed on the wafer W, that is, the alignment marks AM, include wafer marks Mx for measuring the position information in the X-direction and wafer marks My for measuring the position information in the Y-direction. In FIG. 3A, the state is shown with wafer marks Mx arranged in the field of the alignment system 15. Note that in this embodiment, the example was explained of use of alignment marks AM comprised of the one-dimensional measurement marks Mx, My, but the present invention is not limited to this. It may also be applied to use of two-dimensional measurement marks AM2 (FIG. 3B) as alignment marks.

Here, an image of a detection region 33X in the XP direction including indicator marks 31a, 31b and wafer mark images MxP is captured by the X-axis image capturing device 26X of FIG. 2. On the other hand, an image of a detection region 33Y in the YP direction including indicator marks 32a, 32b and Y-axis wafer marks My (patterns of X-axis wafer marks Mx rotated 90°) is captured by the Y-axis image capturing device 26Y of FIG. 2.

Further, the scan directions when reading opto-electric conversion signals from the pixels of the image capturing devices 26X, 26Y are set to the XP direction and YP direction. By processing the image signals of the image capturing devices 26X, 26Y, it is possible to find the XP direction positional deviation of the X-axis wafer mark images MxP and indicator marks 31a, 31b and the YP direction positional deviation of the images of the Y-axis wafer mark My and the indicator marks 32a, 32b.

Therefore, in FIG. 2, the coordinate calculation circuit 12a finds the X-coordinates on the stage coordinate system (X, Y) of the wafer marks Mx from the positional relationships between the images MxP of the wafer marks Mx on the wafer W and the indicator marks 31a, 31b on the indicator plate 22 and from the measurement results of the laser interferometer system 12 at that time and supplies the thus measured X-coordinates to the exposure control apparatus 6. Similarly, the Y-coordinates on the stage coordinate system (X, Y) of the Y-axis wafer marks are also measured and supplied to the exposure control apparatus 6.

Note that while the illustration and detailed explanation will be omitted, this exposure apparatus 200 may be provided with, in addition to the above-mentioned FIA (Field Image Alignment) type alignment system 15, an LSA (Laser Step Alignment) type or an LIA (Laser Interferometric Alignment) type alignment system or further a double diffraction grating type alignment system such as disclosed in WO98/39689. These are preferably suitably selectively used. An LSA type sensor is an alignment sensor emitting a laser beam to an alignment mark formed on a substrate and utilizing the diffracted and scattered light to measure the position of the alignment mark, while an LIA type alignment sensor emits laser beams of slightly different wavelengths from two directions to a diffraction grating shaped alignment mark formed on the substrate surface, causes the resultant two diffracted light beams to interfere with each other, and detects position information of the alignment mark from the phase of this interference light. A double diffraction grating type alignment sensor emits a laser beam vertical to a diffraction grating shaped alignment mark formed on the substrate surface, rediffracts the resultant ±n order diffracted lights on the reference grating, and utilizes this light to measure the position of the alignment mark. Note that the exposure apparatus 200 of this embodiment is assumed to be provided with both FIA type and LSA type alignment systems.

The exposure control apparatus 6 measures sample points (alignment marks AM attached to sample shots) of a plurality of shot areas (sample shots) among the shot areas set on a wafer W in accordance with default alignment parameters or alignment parameters determined by a later explained alignment simulator 600 using an alignment system 15 (in some cases another LSA, LIA, or other type sensor) and performs EGA computation based on the measurement results to calculate the array of shot areas on the wafer W. Further, it moves the wafer stage 10 in accordance with the EGA computation results to position each shot area at the exposure area (projection area of projection optical system PL) and perform exposure. At this time, the exposure control apparatus 6 stores the EGA computation results and mark waveform signal data in a hard disk drive or other storage device provided in the exposure control apparatus 6 as a log file. This log file is used for determination of the optimal alignment parameters by the later explained alignment simulator 600.

Figure 4:
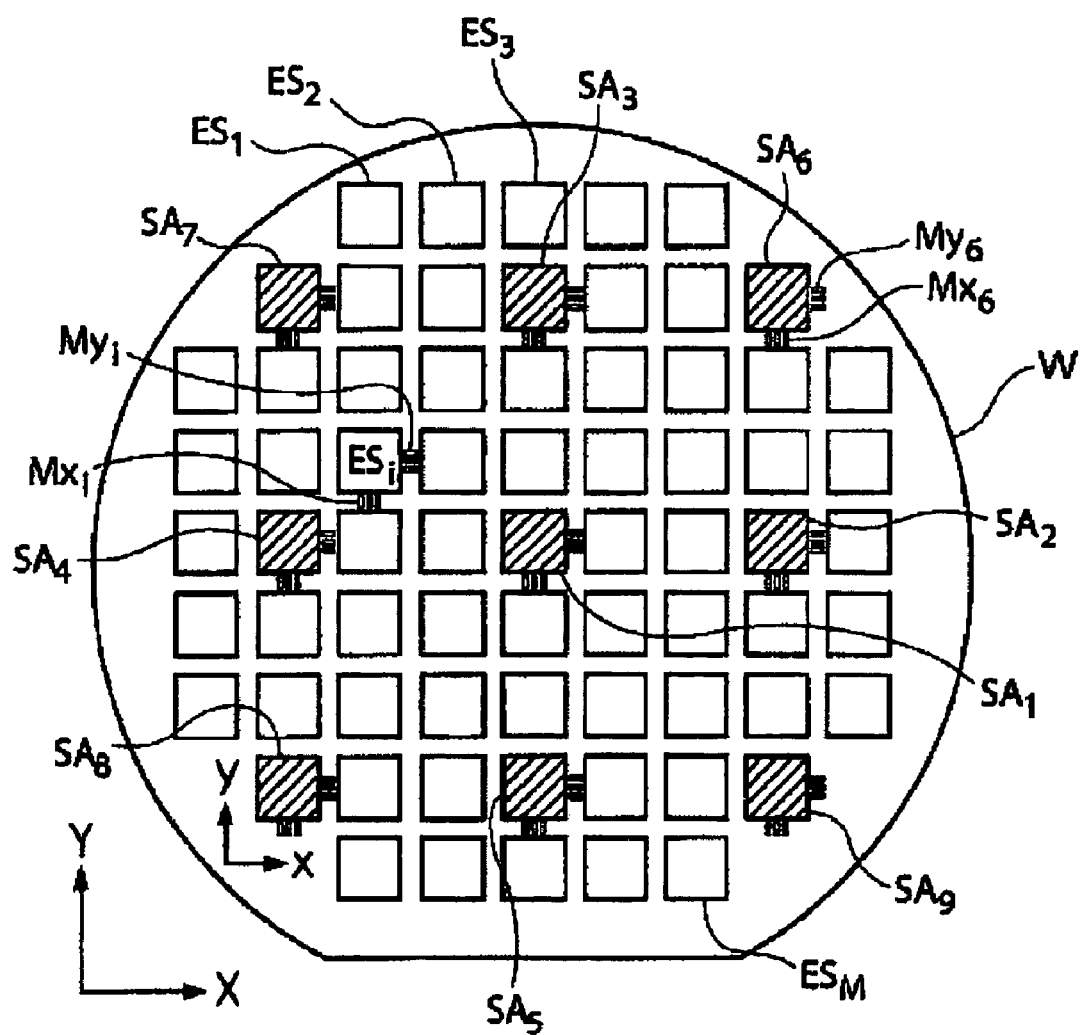
FIG. 4 is a view of an example of an array of shot areas set on a wafer.

Next, the shot areas set on the wafer W to be exposed will be explained. FIG. 4 is a view showing an example of the array of shot areas set on the wafer W. As shown in FIG. 4, the wafer W is set with a coordinate system (x, y) different from the stage coordinate system (X, Y) shown in FIG. 2. Shot areas ES1, ES2, . . . , ESM (M is an integer of 2 or more) are formed regularly along this coordinate system (x, y). Each shot area ESi (i=1 to M) is formed with chip patterns by the steps up to then. Further, each shot area ESi is defined by predetermined width street lines (scribe lines) extending in the x-direction and y-direction. X-axis wafer marks Mxi are formed at the center of the street line extending in the x-direction adjoining each shot area ESi, while Y-axis wafer marks Myi are formed at the center of the street line extending in the y-direction adjoining each shot area ESi.

The three X-axis wafer marks Mxi and the three Y-axis wafer marks Myi used in this embodiment are arranged as straight line patterns at predetermined pitches in the x-direction or y-direction. These patterns are formed as concave or convex patterns at the bottom surface of the wafer W. The X-coordinates (designed coordinate values/design values) xi of the wafer marks Mxi of the coordinate system (x, y) on the wafer W and the y-coordinates (designed coordinate values/design values) yi of the wafer marks Myi are known and are stored in a not illustrated storage device attached to the exposure control apparatus 6 of FIG. 2. In this case, the X-coordinates of the wafer marks Mxi and the y-coordinates of the wafer marks Myi are deemed the shot X-coordinates and y-coordinates of the areas ESi.

Further, a predetermined number of shot areas in the plurality of shot areas ES1 to ESM set on the wafer W are selected as sample shots (sample areas). In the example shown in FIG. 4, the nine hatched shot areas are selected as the sample shots SA1 to SA9. Each of the sample shots SA1 to SA9 is provided with the wafer marks Mx, My. For example, the sample shot SA6 is provided with the wafer marks Mx6, My6. Further, the wafer W is formed with two two-dimensional search/alignment marks (not illustrated) for rough positioning (search/alignment). The coordinate values at the coordinate system (x, y) of these two search/alignment marks on the wafer W are known.

[Coater/Developer]

Next, the coater/developer 300 and substrate conveyor apparatus provided in each substrate processing apparatus will be explained with reference to FIG. 5. The coater/developer 300 is arranged in a chamber surrounding the exposure apparatus 200 to inscribe it by an in-line system. The coater/developer 300 is provided with a conveyor line 301 for conveying the wafers W cutting across its center. At one end of this conveyor line 301, a wafer carrier 302 storing a large number of wafers W not yet exposed or processed at the substrate processing apparatus of the previous process and a wafer carrier 303 storing a large number of wafers W finished being exposed and developed in this substrate processing apparatus are arranged. At the other end of the conveyor line 301, a conveyor opening (not illustrated) provided with a shutter is provided at the side surface of the chamber of the exposure apparatus 200.

Further, a coater unit 310 is provided along one side of the conveyor line 301 provided at the coater/developer 300, while a developer unit 320 is provided along the other side. The coater unit 310 is comprised of a resist coater 311 for coating the wafer W with a photoresist, a prebake device 312 comprised of a hot plate for prebaking the photoresist on the wafer W, and a cooling device 313 for cooling the prebaked wafer.

The developer unit 320 is provided with a postbake device 321 for baking a photoresist on a wafer W after exposure, that is, performing so-called PEB (Post-Exposure Baking), a cooling device 322 for cooling the PEB wafer W, and a developer 323 for developing the photoresist on the wafer W.

Further, at the downstream side of the developer 323, an overlay measuring device 400 is set in-line. This overlay measuring device 400 is a device for measuring the relative positions of a lower mark formed on the wafer W at the previous process and a resist pattern (overlay mark) formed in the immediately previous exposure process (exposure process by exposure apparatus 200) to detect the overlay error. For example, the one disclosed in Japanese Patent Publication (A) No. 2003-97913 may be employed.

Figure 5:
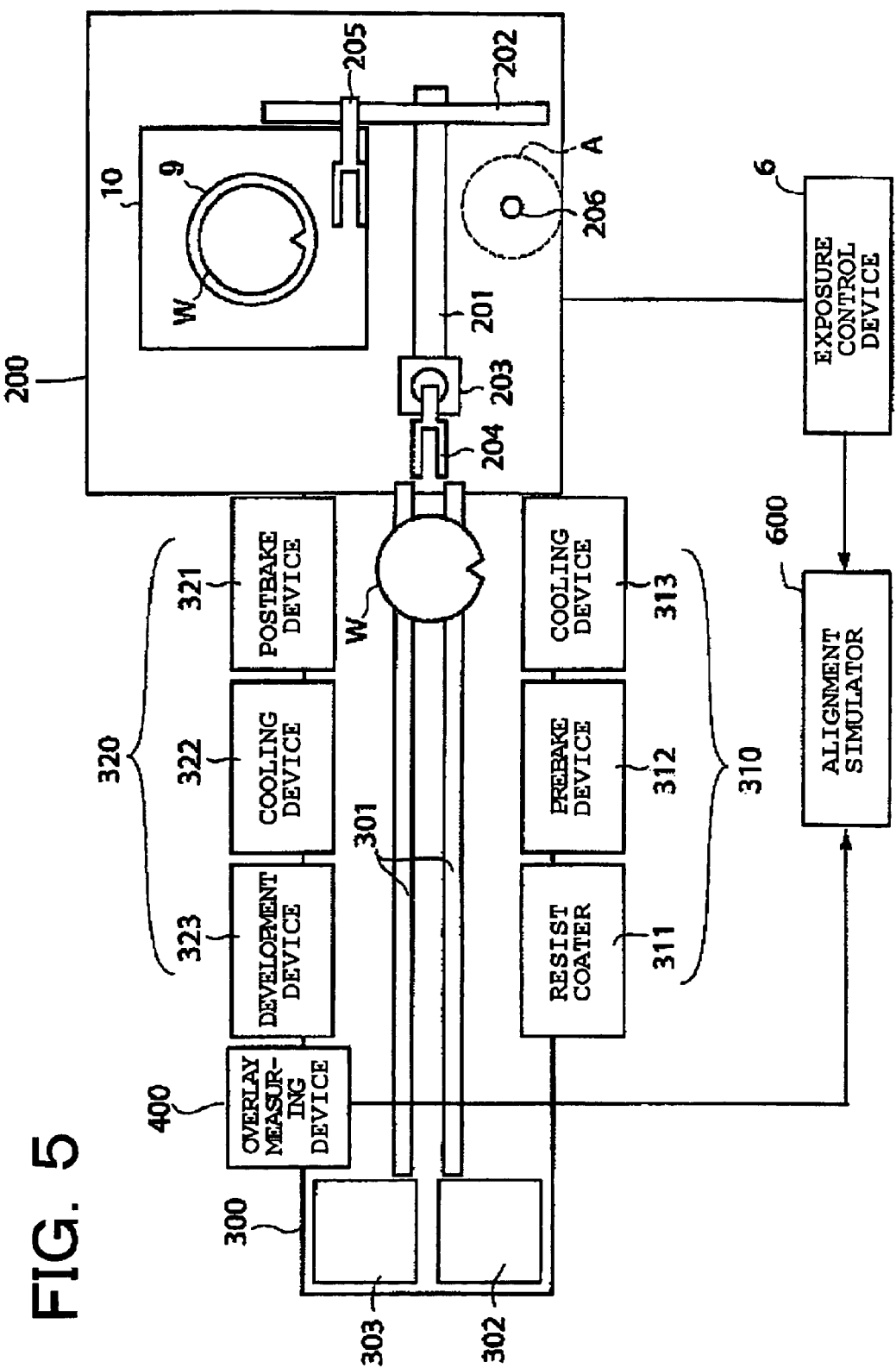
FIG. 5 is a view of the general configuration of a coater/developer connected in line to an exposure apparatus in an embodiment of the present invention.

Note that regarding the configuration and layout of each unit forming the coater unit 310 (resist coater 311, prebake device 312, and cooling device 313), each unit forming the developer unit 320 (postbake device 321, cooling device 322, and developer 323), and overlay measuring device 400, the layout shown in FIG. 5 is merely for convenience (just one example). In fact, a greater plurality of other processing units and buffer units etc. are provided, the units are arranged spatially, and robot arms, elevators, etc. are provided between the units. Further, the sequence of the processing (path of conveyance of wafers) is also not necessarily the same. Which path a wafer W passes over between the different units for processing is optimized based on the contents of processing of the processing units, the increase of speed of the processing as a whole, and other aspects and is sometimes dynamically changed.

The main control system provided in the exposure apparatus 200, that is, the exposure control apparatus 6, the coater unit 310 and developer unit 320, the overlay measuring device 400, and the alignment simulator 600 are connected wired or wirelessly. Signals indicating the start of processing or end of processing are sent back and forth between them. Further, the overlay error measured by the overlay measuring device 400 is sent (notified) to the alignment simulator 600. The alignment simulator 600 records the sent information at a hard disk or other storage device attached to this.

The exposure apparatus 200 is provided inside it with a first guide member 201 so as to substantially follow the extension of the center axis of the conveyor line 301 provided in the coater/developer 300 and is provided inside it with a second guide member 202 so as to orthogonally intersect the first guide member 201 above its end.

The first guide member 201 is provided with a slider 203 configured to be able to slide along the first guide member 201. This slider 203 is provided with a first arm 204 holding a wafer W rotatably and movably in the vertical direction. Further, the second guide member 202 is provided with a second arm 205 configured to be able to slide along the second guide member 202 in the state holding the wafer W.

The second guide member 202 extends up to the loading position of the wafer of the wafer stage 9, while the second arm 205 is provided with a mechanism for sliding in a direction orthogonally intersecting the second guide member 202.

Further, at the vicinity of the position where the first guide member 201 and the second guide member 202 intersect is provided a receiving pin 206 able to rotate and move in the vertical direction for prealignment of the wafer W. Around the receiving pin 206 is provided a position detector (not illustrated) for detecting the positions of a notch at the outer circumference of the wafer W and two edges of the wafer or an orientation flat formed at the outer circumference of the wafer W and wafer edges. The first guide member 201, second guide member 202, slider 203, first arm 204, second arm 205, receiving pin 206, etc. form a wafer loader system (substrate conveyor apparatus).

[Wafer Process]

Next, the processing of the wafer W will be simply explained including the operations of the different devices. First, the factory production control host system 700 in FIG. 1A outputs a processing start command through the network and exposure process control controller 500 to the exposure control apparatus 6. The exposure control apparatus 6 outputs various types of control signals to the exposure apparatus 200, coater unit 310, developer unit 320, and overlay measuring device 400 based on this processing start command. When such a control signal is output, one wafer taken out from the wafer carrier 302 is conveyed through the conveyor line 301 to the resist coater 311 where it is coated with a photoresist, then is successively conveyed along the conveyor line 301 through the prebake device 312 and cooling device 313 whereby the wafer W is received by the first arm 204 of the exposure apparatus 30. After this, when the slider 203 slides along the first guide member 201 and reaches near the receiving pin 206, the first arm 204 rotates whereby the wafer W is transferred from the first arm 204 to the position A on the receiving pin 206. Here, the wafer W is adjusted in center position and rotational angle based on its outside shape (prealigned). After this, the wafer W is received by the second arm 205 and conveyed along the second guide member 202 to the wafer loading position where it is loaded at the wafer holder 9 on the wafer stage 10.

Further, processing is performed under predetermined alignment parameters (default parameters) to measure the marks, perform EGA computation based on the measurement results, and perform alignment for positioning the shot areas on the wafer at the exposure apparatus based on the computation results, then the patterns of the reticle are transferred by exposure to the shot areas on the positioned (aligned) wafer W. At this time, the exposure control apparatus 6 stores the EGA computation results and the measured mark waveform signal data in a hard disk drive or other storage device (memory) provided in the exposure control apparatus 6 as a log file (log data).

The wafer W finished being exposed is conveyed along the second guide member 202 and first guide member 201 to the conveyor line 201 of the coater/developer 300, and then the wafer is sent along the conveyor line 301 successively through the postbake device 321 and cooling device 322 to the developer 323. Further, each shot area of the wafer W developed at the developer 323 is formed with relief resist patterns corresponding to the device patterns of the reticle. The thus developed wafer W is measured for overlay error at each shot or any shot by the overlay measuring device 400, then is stored at the wafer carrier 303 by the conveyor line 301. After the end of this lithography process, for example one lot of wafers in the wafer carrier 303 is transferred to another processing apparatus where it is etched, the resist is removed, etc.

The overlay error measured by the overlay measuring device 400 is sent as reference overlay data to the alignment simulator 600. Note that the overlay error may be measured not only by the measuring device 400, but also the alignment system (FIA) 15 in the exposure apparatus 200. For this reason, when this alignment system 15 measures the overlay error, this error data is sent from the exposure control apparatus 6 to the simulator 600.

The above-mentioned wafer computation is performed by each substrate processing apparatus. Each substrate processing apparatus is controlled and managed overall by an exposure process control controller 500. That is, the exposure process control controller 500 stores in an attached storage device the various information for controlling the processing of each lot or each wafer processed at the exposure system 100 and the various parameters or exposure history data or other various information for the same. Further, each exposure apparatus 200 is controlled and managed so that each lot is suitably processed based on the information.

[Alignment Simulator]

Figure 6:
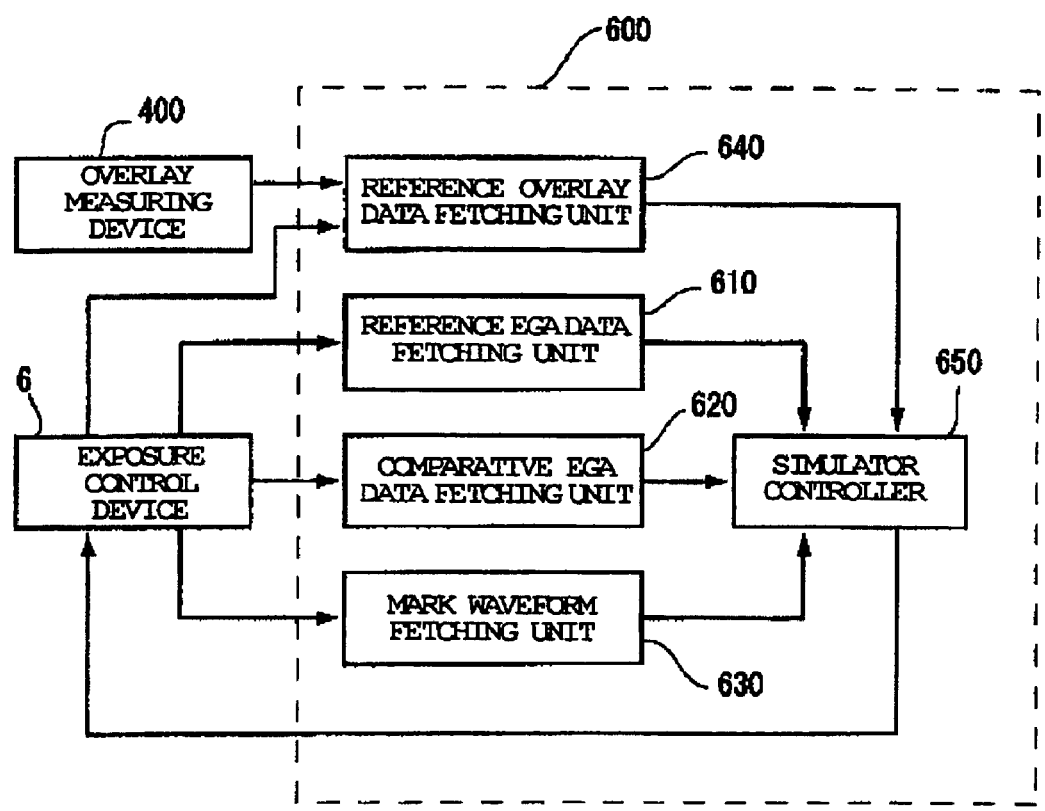
FIG. 6 is a block diagram of the general configuration of an alignment simulator according to an embodiment of the present invention.

FIG. 6 is a block diagram of the general configuration of an alignment simulator 600 provided in this exposure system 100. The alignment simulator 600 is comprised of a reference EGA data fetching unit 610, comparative EGA data fetching unit 620, mark waveform fetching unit 630, reference overlay data fetching unit 640, and simulator controller 650.

The reference EGA data fetching unit 610 obtains results of EGA computation performed under predetermined reference alignment parameters (reference alignment parameters) set as default in the exposure control apparatus 6 (reference computation results), that is, reference EGA data, from the exposure control apparatus 6. Note that the "reference alignment parameters" means the illumination parameters at the time of identification of the sample shot to be measured or measurement of the marks, the waveform processing algorithms for the obtained mark signals, and the parameters of the state where the EGA computation model etc. are set at default predetermined parameters (including the later explained waveform processing parameters and parameters requiring measurement). The comparative EGA data fetching unit 620 obtains the results of EGA computation performed while changing all or part of the reference alignment parameters in the exposure control apparatus 6 (comparative computation results), that is, the comparative EGA data, from the exposure control apparatus 6. The mark waveform fetching unit 630 obtains the mark waveform signal data for each mark from the exposure control apparatus 6 when performing the EGA measurement. The reference overlay data fetching unit 640 obtains the measurement results (reference overlay data/ reference processing results) of the overlay error (processing error) of the circuit patterns measured by the overlay measuring device 400. The simulator controller 650 performs the later explained processing to determine the optimal alignment parameters based on the reference EGA data, comparative EGA data, mark waveform signal data, and reference overlay data obtained from these units 610, 620, 630, and 640 and notifies the determined alignment parameters to the exposure control apparatus 6.

Below, the processing at the alignment simulator 600 will be explained, including the related processing at the exposure apparatus 200, in accordance with the flow chart shown in FIG. 7 and FIG. 8.

Figure 7:
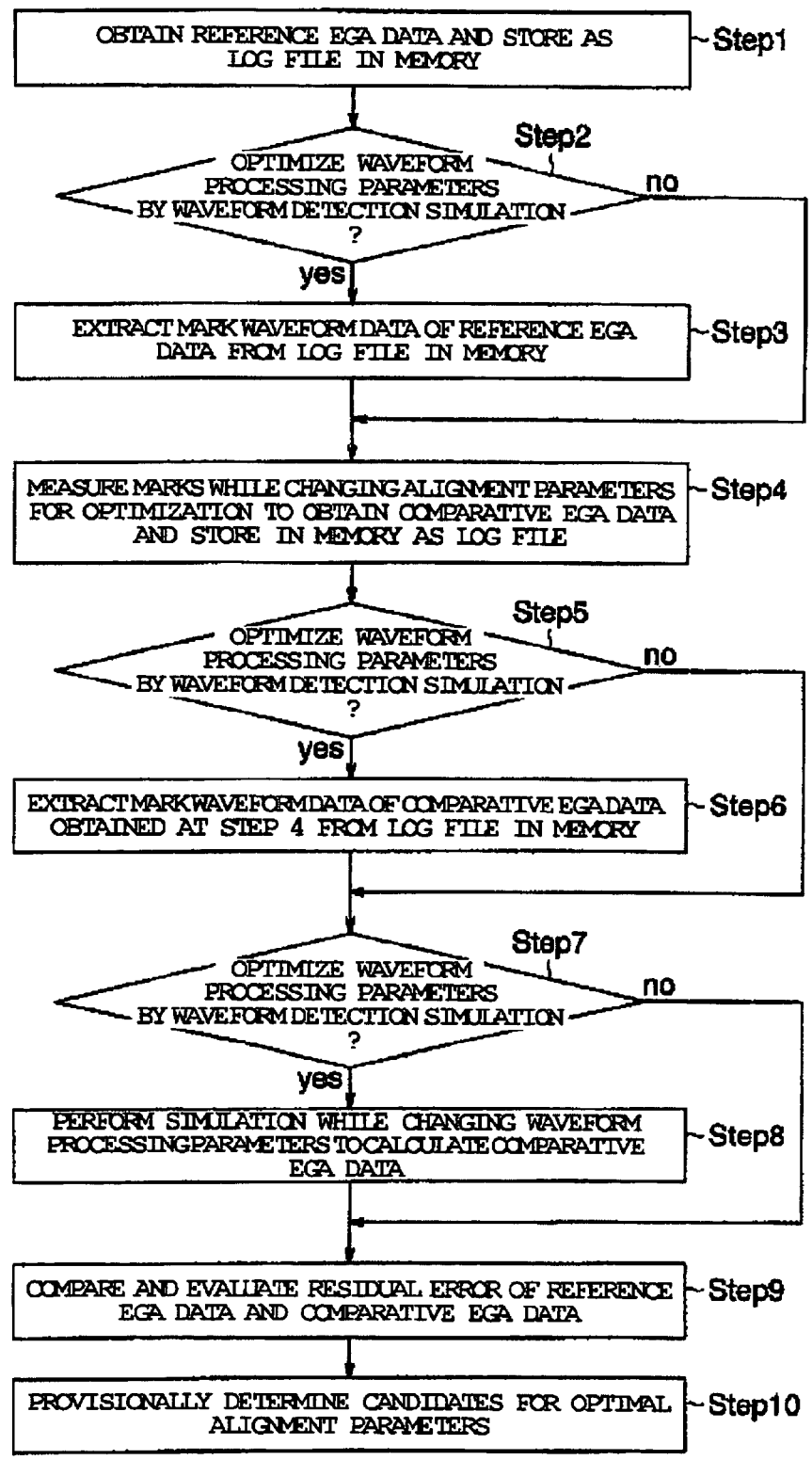
FIG. 7 is a flow chart of EGA simulation according to an alignment simulator according to an embodiment of the present invention.

First, the flow chart of the alignment simulation processing shown in FIG. 7 will be referred to. The reference EGA data fetching unit 610 of the alignment simulator 600 obtains the reference EGA data obtained at the exposure control apparatus 6 (step 1). More specifically, the exposure apparatus 200 loads the wafer W (reference wafer used for optimizing the alignment parameters (measurement only wafer)) on the stage 10, performs the position measurement for marks (Mxi, Myi) set for sample shots shown in FIG. 4 (for example, SA1 to SA9 in FIG. 4) by the FIA type alignment system 15 (or another LSA type alignment system) in accordance with default predetermined reference alignment parameters, then performs the EGA computation based on the measurement results and the design positions of the marks (Mxi, Myi), and stores the EGA computation results as reference EGA data in a storage device attached to the exposure control apparatus 6 as a log file. In the alignment simulator 600, the reference EGA data fetching unit 610 obtains the reference EGA data from this log file.

Note that the alignment simulator 600 includes an alignment unit library of the same processing content as the alignment unit of the exposure apparatus 200. It is excellent in the operability for setting and registering alignment parameters and records several versions of alignment unit libraries. These can be selected and switched in accordance with the type of the exposure apparatus to be optimized or the version of the software. This enables fast simulation and evaluation with diverse parameters.

The exposure apparatus 200 also stores the mark waveform signal data for the marks (Mxi, Myi) at the time of this EGA measurement in the storage device (memory) attached to the exposure control apparatus 6 as a log file (log data).

Next, the simulator controller 650 judges whether to optimize the waveform processing parameters (explained later) by waveform detection simulation in accordance with instructions input by the operator in advance (step 2). When judging to optimize the waveform processing parameters by the waveform detection simulation (case of YES), the mark waveform fetching unit 630 of the alignment simulator 600 obtains the mark waveform signal data for the marks (Mxi, Myi) according to the reference EGA data from the exposure control apparatus 6 by extracting it from the memory (step 3), then the routine proceeds to step 4. When judging at step 2 not to optimize the waveform processing parameters by waveform detection simulation (case of NO), step 3 is not executed and the routine proceeds to step 4. That is, in this case, the waveform detection simulation at the later explain step 8 using the mark waveform data of the reference EGA data is not performed, so comparative EGA data derived from the mark waveform data of the reference EGA data cannot be obtained.

Next, the comparative EGA data fetching unit 620 of the alignment simulator 600 obtains the comparative EGA data obtained at the exposure control apparatus 6 (step 4). More specifically, the exposure apparatus 200 changes all or part of the parameters requiring measurement (explained later) included in the alignment parameters for optimization (explained later), among the reference alignment parameters for the wafer W loaded on the wafer stage 10, for use as comparative alignment parameters, performs the position measurement (measurement) by the FIA type alignment system 15 (or other LSA type alignment system) for the marks (Mxi, Myi) set for the sample shots in accordance with the comparative alignment parameters (for example, the sample shots SA1 to SA9 in FIG. 4 or partially or fully changed sample shots), then performs the EGA computation based on the measurement results and the design positions of the marks (Mxi, Myi), and stores the EGA computation results as comparative EGA data in a storage device attached to the exposure control apparatus 6 as a log file. In the alignment simulator 600, the comparative EGA data fetching unit 620 obtains the comparative EGA data from this log file. This step 4 is repeated (measurement operation is performed) a number of times corresponding to the combinations in accordance with the content of change of the alignment parameters for optimization, therefore a plurality of comparative EGA data is obtained.

Note that to avoid the effects of wafer offset and rotation, this step 4 is performed from the loading the wafer W on the stage 10 to just before unloading it. Further, before this EGA measurement (fine measurement), search measurement (rough measurement) is performed for detecting the rough position of the wafer W. To avoid the effect of offset accompanying the search measurement, after the search measurement, it is preferable to repeat only the EGA measurement for the wafer W for the number of parameters. However, when the number of EGA measurements after the search measurement is limited due to the requirements of the exposure sequence (for example, when the number of EGA measurements after the search measurement is limited to two), the first EGA measurement after the search measurement (fine measurement) is performed under the same alignment parameters, then the alignment parameters are set so that the following next EGA measurement (fine measurement) is performed under changed alignment parameters. By doing this, when performing EGA measurement twice, the first EGA measurement is already performed, so the results of the first EGA measurement can be reflected back as reference for the second EGA measurement. Therefore, the effects of the offset accompanying repeated search measurement can be reduced to within the precision of the EGA measurement (first fine measurement).

Here, the alignment parameters are basically all alignment parameters covered by the optimization (in this embodiment, referred to as "alignment parameters for optimization"). In this embodiment, the alignment parameters for optimization are processed by the alignment simulator 600. Further, the alignment parameters for optimization may be classified as alignment parameters not requiring measurement of the marks again (in the present embodiment, referred to as the "waveform processing parameters") and alignment parameters requiring measurement of the marks again (in the present embodiment, referred to as "parameters requiring measurement").

These waveform processing parameters include the combinations used in already measured marks (number of marks and layout of marks (corresponding to only direction reducing measured marks), presence of rejects in mark units or shot units (exclusion of specific marks from EGA computation), reject limit values at time of mark detection (threshold values when rejecting marks from EGA computation), mark detection parameters (FIA/LSA, signal processing algorithms (edge extraction method, template matching method, repeated auto correlation method, etc.), slice level, etc.), statistical processing models used at the time of statistical processing (six-parameter model, 10-parameter model, shot averaging model, shot factor indirect application model, higher order EGA processing parameters (order of use and coefficient of correction used), etc.), weighted EGA processing parameters, expanded EGA processing parameters of EGA option functions (shot multipoint EGA parameters, EGA calculation model, shot component correction parameters, etc.), and amounts of correction to be applied to measured positions of measured marks (alignment correction values etc.), etc.

Further, the parameters requiring measurement include the types of marks (including cases of different shapes), their number and layout (case of measuring new sample points), illumination parameters when illuminating marks at time of measurement of marks (illumination wavelength, bright/dark fields, illumination strength, phase difference illumination, etc.), focus state at time of mark detection (focus offset etc.), alignment sensors used, etc.

Note that all of the alignment parameters are basically all variable as explained above, but it is also possible not to optimize (make variable) all of the alignment parameters and to make part of the alignment parameters invariable (fixed). At the time, which alignment parameters to make fixed (invariable) parameters may be suitably freely selected and set by the user.

As the shot array modification calculation models used as the statistical processing models used for the EGA computation performed in the exposure control apparatus 6 or alignment simulator 600, the following may be illustrated:

(1) Shot array modification calculation model in normal EGA (use in stage coordinate 0 to 1)

$$\Delta X = Cx\_10*Wx + Cx\_01*Wy + Cx\_sx*Sx + Cx\_sy*Sy + Cx\_00 \quad \text{(equation 1)}$$

$$\Delta Y = Cy\_10*Wx + Cy\_01*Wy + Cy\_sx*Sx + Cy\_sy*Sy + Cy\_00 \quad \text{(equation 2)}$$

The meanings of the variables are as follows:

Wx, Wy: position of measurement point having center of wafer as origin

Sx, Sy: position of measurement point having center of shot as origin

Cx__10: wafer scaling X

Cx__01: wafer rotation

Cx_sx: shot scaling X

Cx_sy: shot rotation

Cx__00: offset X

Cy__10: wafer rotation

Cy__01: wafer scaling Y

Cy_sx: shot rotation

Cy_sy: shot scaling Y

Cy__00: offset Y

If using the above variables for expression, the wafer orthogonality is −(Cx__01+Cy__10) and the shot orthogonality is −(Cx_sy+Cy_sx).

Note that in this embodiment, depending on which of the above parameters is used, the EGA computation model (statistical processing model) is called a "six-parameter model" (normal EGA model), "10-parameter model" (shot multipoint model), and "shot averaging model". The "six-parameter model" is a model using, among the above parameters, the wafer scalings X, Y, wafer rotation, wafer orthogonality, and offsets X, Y. The "10-parameter model" is a model comprised of six-parameter model using the additional total four parameters of shot scalings X, Y, shot rotation, and shot orthogonality. The "shot averaging model" is a model averaging the measured values of the plurality of marks in a shot to calculate one representative value for the shot and using this for EGA computation of each shot position using parameters (six parameters) similar to the above six-parameter model. Other than these, there is a shot factor indirect application model. This model is a model finding the wafer error parameters by the six-parameter model and, when finding the shot error parameters, using the 10-parameter model and entering the wafer error parameters found by the six-parameter model for its wafer error parameters so as to find the shot error parameters. For example, it is a model able to find the wafer error components for the same six-parameter model for all wafers when executing shot multipoint measurement by a single wafer or interval.

(2) Shot array modification calculation model in high order EGA (use from stage coordinate 0 to 2)

$$\Delta X = Cx\_20 * Wx^2 + Cx\_11 * Wx * Wy + \\ Cx\_02 * Wy^2 + Cx\_10 * Wx + Cx\_01 * Wy + \\ Cx\_00 + Cx\_sx * Sx + Cx\_sy * Sy$$ (equation 3)

$$\Delta Y = Cy\_20 * Wx^2 + Cy\_11 * Wx * Wy + \\ Cy\_02 * Wy^2 + Cy\_10 * Wx + Cy\_01 * Wy + \\ Cy\_00 + Cy\_sx * Sx + Cy\_sy * Sy$$ (equation 4)

(3) Shot array modification calculation model in high order EGA (use from stage coordinate 0 to 2)

$$\Delta X = Cx\_30 * Wx^3 + Cx\_21\ Wx^2 * Wy + \\ Cx\_12 * Wx * Wy^2 + Cx\_03 * Wy^3 + Cx\_20 * Wx^2 + \\ Cx\_11\ Wx * Wy + Cx\_02 * Wy^2 + Cx\_10 * Wx + \\ Cx\_01 * Wy + Cx\_00 + Cx\_sx * Sx + Cx\_sy * Sy$$ (equation 5)

$$\Delta Y = Cy\_30 * Wx^3 + Cy\_21 * Wx^2 * Wy + \\ Cy\_12\ Wx * Wy^2 + Cy\_03 * Wy^3 + Cy\_20 * Wx^2 + \\ Cy\_11 * Wx * Wy + Cy\_02 * Wy^2 + Cy\_10 * Wx + \\ Cy\_01 * Wy + Cy\_00 + Cy\_sx * Sx + Cy\_sy * Sy$$ (equation 6)

When measuring one point in a shot, the shot correction coefficients Cx_sx, Cx_sy, Cy_sx, Cy_sy of (equation 1) to (equation 6) are excluded (that is, "0" is set).

Further, "weighted EGA", for example as disclosed in Japanese Patent Publication (A) No. 5-304077, means weighting each coordinate position of a sample shot in accordance with the distance between the shot to be positioned and each other shot and statistically processing this weighted plurality of coordinate positions to calculate the computation parameters. In this case, the method of calculation of the coefficient of weighting etc. is changed as a waveform processing parameter.

Next, the simulator controller 650, at FIG. 7, judges whether to optimize the waveform processing parameter for the mark waveform data measured at step 4 by waveform detection simulation in accordance with an instruction input by the operator in advance (step 5). If judging to optimize the waveform processing parameter by the waveform detection simulation (case of YES), the mark waveform fetching unit 630 of the alignment simulator 600 obtains the mark waveform signal data for the marks (Mxi, Myi) of the comparative EGA data found at step 4 by extraction from the memory of the exposure control apparatus 6 (step 6), then the routine proceeds to step 7. If judging at step 5 not to optimize the waveform processing parameters by the waveform detection simulation (case of NO), step 6 is not executed and the routine proceeds to step 7. When waveform detection simulation is set at step 7, the routine proceeds to step 8, while when not, the routine proceeds to step 9.

At step 8, the simulator controller 650 changes part or all of the above waveform processing parameters based on the mark waveform signal data of the reference EGA data extracted and obtained at step 3 and/or the mark waveform signal data of the comparative EGA data obtained at step 6 and simulates EGA computation the same as the EGA computation of the above exposure control apparatus 6 in accordance with the change in the waveform processing parameters exactly the number of times corresponding to the combinations so as to obtain a plurality of comparative EGA data.

Next, the simulator controller 650 compares and evaluates all of the comparative EGA data obtained at step 4 and the comparative EGA data calculated at step 8 when step 8 is executed and the reference EGA data (step 9) and, based on the results of comparison and evaluation, provisionally determines the optimal alignment parameters (alignment parameters for optimization) (step 10). The "provisional determination" here means narrowing down the plurality of parameters to the preferable candidates. At this step 10, for example, the residual error according to the reference EGA data and the residual error according to the comparative EGA data are compared, candidates with residual error larger than the reference EGA data are eliminated and candidates with residual error smaller are provisionally determined as candidates. When there are no candidates where the residual error is smaller than the reference EGA data error, the candidates provisionally determined here become zero. As the criteria for evaluation of the residual error, the standard error ($3\sigma$ value) of the residual error component (random error component) can be used. The smaller the standard error, the stabler the alignment mark and alignment sensor, that is, the stabler the position of detection of the alignment mark.

Note that the comparison and evaluation at this step 9 are not limited to the above. Various types may be employed. For example, in addition to the "standard error", the "average", "absolute value of average+$3\sigma$", or other statistical technique or combination of the same may be used for comparison and evaluation. Further, instead of comparing the reference EGA data and each of the comparative EGA data, it is also possible to provisionally determine a predetermined number of data with the smallest residual error among all of these or establish a predetermined threshold value for the residual error and provisionally determine ones with error smaller than this threshold value as candidates.

Further, at step 4, EGA measurement and EGA computation are performed in accordance with comparative alignment parameters obtained by changing part or all of the parameters requiring measurement among the alignment parameters for optimization, but at this time it is also possible to perform the EGA measurement/computation while changing the above-mentioned waveform processing parameters. However, as explained above, there are many types of waveform processing parameters (combinations of parameters also require consideration) and the exposure apparatus is kept occupied at the time of measurement. Therefore, it is more efficient to designate optimization of the waveform processing parameters for the EGA measurement results of step 4 at step 5 by waveform detection simulation, obtain the mark waveform signal data of the comparative EGA data from the exposure apparatus at step 6, and obtain the comparative processing data by waveform detection simulation at step 8.

Figure 8:
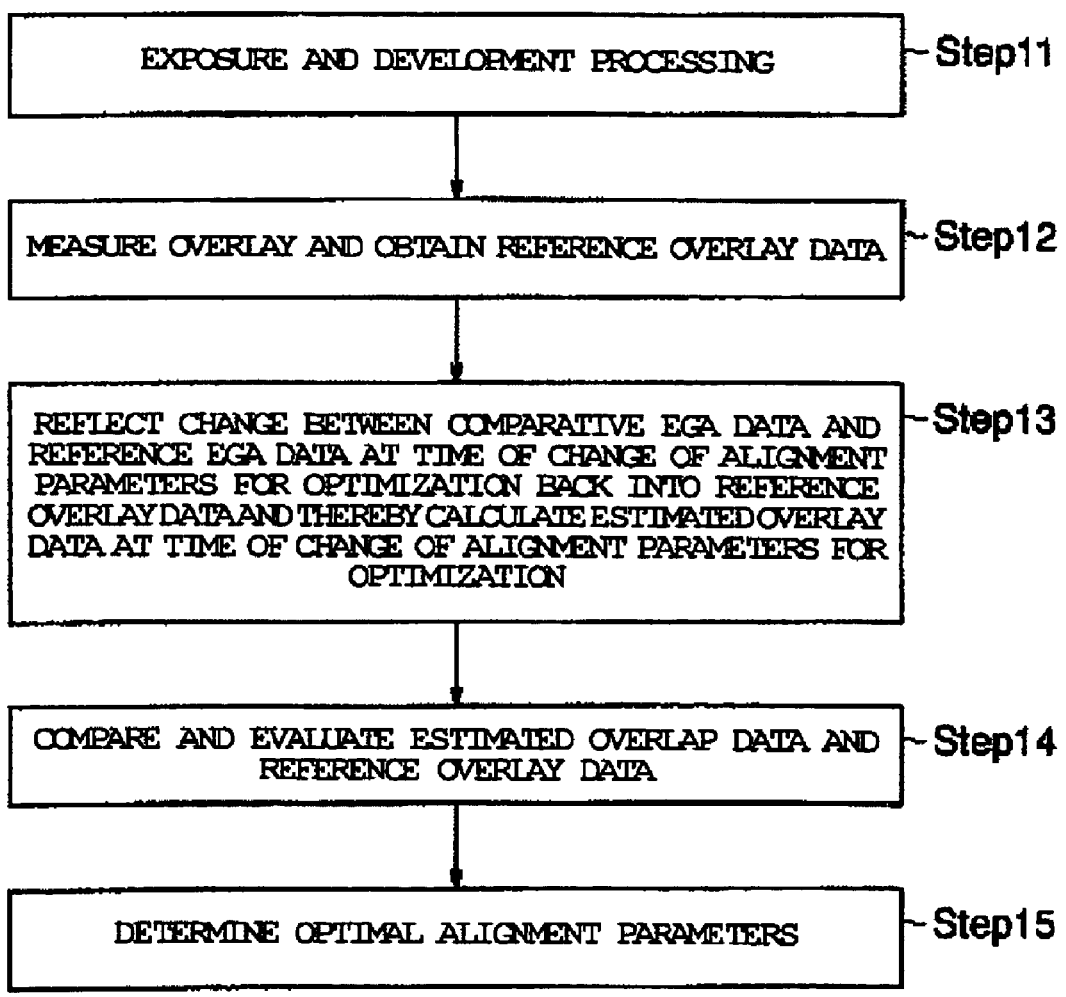
FIG. 8 is a flow chart of overlay simulation by an alignment simulator according to an embodiment of the present invention.

Next, refer to the flow chart of overlay simulation processing shown in FIG. 8. At step 10 in FIG. 7, candidates for the alignment parameters are provisionally determined, then the routine proceeds to step 11 of FIG. 8 where the exposure apparatus 200 successively exposes the shot areas in accordance with the shot array for all shots of the wafer W corrected based on the reference EGA data. After ending the exposure for all shot areas, it unloads the wafer W from the wafer stage 10. The coater/developer 300 then develops the circuit patterns transferred by exposure on the wafer W and loads the developed wafer W to the overlay measuring device 400.

The overlay measuring device 400 measures the relative positions of the lower marks exposed by the exposure apparatus 200 and formed at the previous process and the overlay marks (resist patterns) exposed by the exposure apparatus 200 and developed by the developer 323 for all shot areas or selected shot areas. It notifies the measurement results as reference overlay data to the alignment simulator 600, so the reference overlay data fetching unit 640 obtains this notified reference overlay data (step 12).

Next, it finds the differences (change) between the reference EGA data obtained at step 1 and the comparative EGA data obtained at step 4 and, when step 8 is performed, the comparative EGA data calculated at step 8 and provisionally determined at step 10, reflects these back to the reference overlay data obtained at step 12 so as to change the alignment parameters for optimization, and finds the overlay error when assuming positioning, exposure, and development of the wafer W in accordance with the changed alignment parameters (estimated overlay data) (step 13). Here, more specifically, it finds the deviations (that is, the overlay error) between the coordinate positions of the overlay marks of the reference overlay data obtained at step 12 (resist patterns formed right before by exposure apparatus 200) shifted in accordance with the change of the comparative EGA data and the coordinate positions of the lower marks of the reference overlay data (patterns formed by previous steps).

Next, the simulator controller 650 compares and evaluates the estimated overlay data obtained at step 13 and the reference overlay data (step 14) and determines the alignment parameters serving as the basis for calculation of the comparative EGA data corresponding to the estimated overlay data or reference overlay data giving the smallest overlay error as the optimal alignment parameters (step 15).

Note that at step 14, for example, it is possible to compare and evaluate the standard errors (3σ values) of the overlay errors of the estimated overlay data and reference overlay data and determine the alignment parameters giving the smallest standard error of overlay error as optimal. This is because the smaller this standard error, the stabler the overlay results.

Note that the comparison and evaluation in this step 14 are not limited to the above. Various types may be employed. For example, in the case not of comparison and evaluation of overlay of different types of marks (between marks of different positions), but of comparison and evaluation by the same mark and changed processing parameters, the effects due to reticle manufacturing error, wafer deformation, changes in wafer surface shape, and differences in stepping etc. are the same, so in addition to the "overlay error 3σ", the values of the "average" and the "absolute value of the average+3σ" may also be used to determine the optimal alignment parameters. Another statistical technique or combination may also be used for comparison and evaluation. Note that when the reference overlay data is the best, the alignment parameters of the reference EGA data are determined as being optimal.

Note that at step 14, the optimal alignment parameters may be determined using the standard error (3σ) of the overlay error of the estimated overlay data and reference overlay data and standard error (3σ) of the residual error of the comparative EGA data and reference EGA data as evaluation criteria.

In the exposure apparatus 200, after this, the alignment simulator 600 measures the marks with respect to the actual process wafer (device production substrate) in accordance with the determined optimal alignment parameters, performs the statistical processing, positions the process wafer W based on the computation results, and successively exposes it.

However, in the above embodiment, the example was shown of using a reference wafer (measurement wafer) W to find the optimal alignment parameters, but it is also possible to use an actual process wafer (device production wafer) to find the optimal alignment parameters. In this case, the alignment parameters are determined based on the EGA computation results (EGA random error). Note that when this random error exceeds a predetermined allowable value, the alignment parameters may be changed and the measurement repeated or the wafer may be recognized as an error wafer and excluded from the wafers for exposure (pattern transfer) (wafer reject or lot reject).

Further, in the case of using a process wafer, the reference EGA data, comparative EGA data, and reference overlay data do not have to be obtained from a single process wafer W. The above series of processing may be performed for a plurality of process wafers W of the same processing content (same lot) and the data obtained for the process wafer W compared, evaluated, etc. using averaging or another statistical technique.

Further, the processing for determination of the optimal alignment parameters by the simulator 600 using a process wafer may be performed for the head wafer in each lot or for a wafer in the middle of the lot and the results of the determination reflected in the exposure processing by the exposure apparatus 200.

Note that in the above-mentioned embodiment, the alignment simulator 600 is provided independent from the substrate processing apparatus (exposure apparatus 200 etc.) This differs in the point that a single alignment simulator 600 can find the alignment parameters used in a plurality of substrate processing apparatuses (exposure apparatuses 200 etc.) However, if for example the exposure control apparatus 6 of the exposure apparatus is superior in processing ability, the functions of the alignment simulator 600 may be made to be performed by the exposure control apparatus 6. Alternatively, this can be realized by dispersal of functions between these or between these or other apparatuses.

[Method of Production of Device]

Next, a method of production of a device using the above exposure system in the lithography process will be explained.

Figure 9:
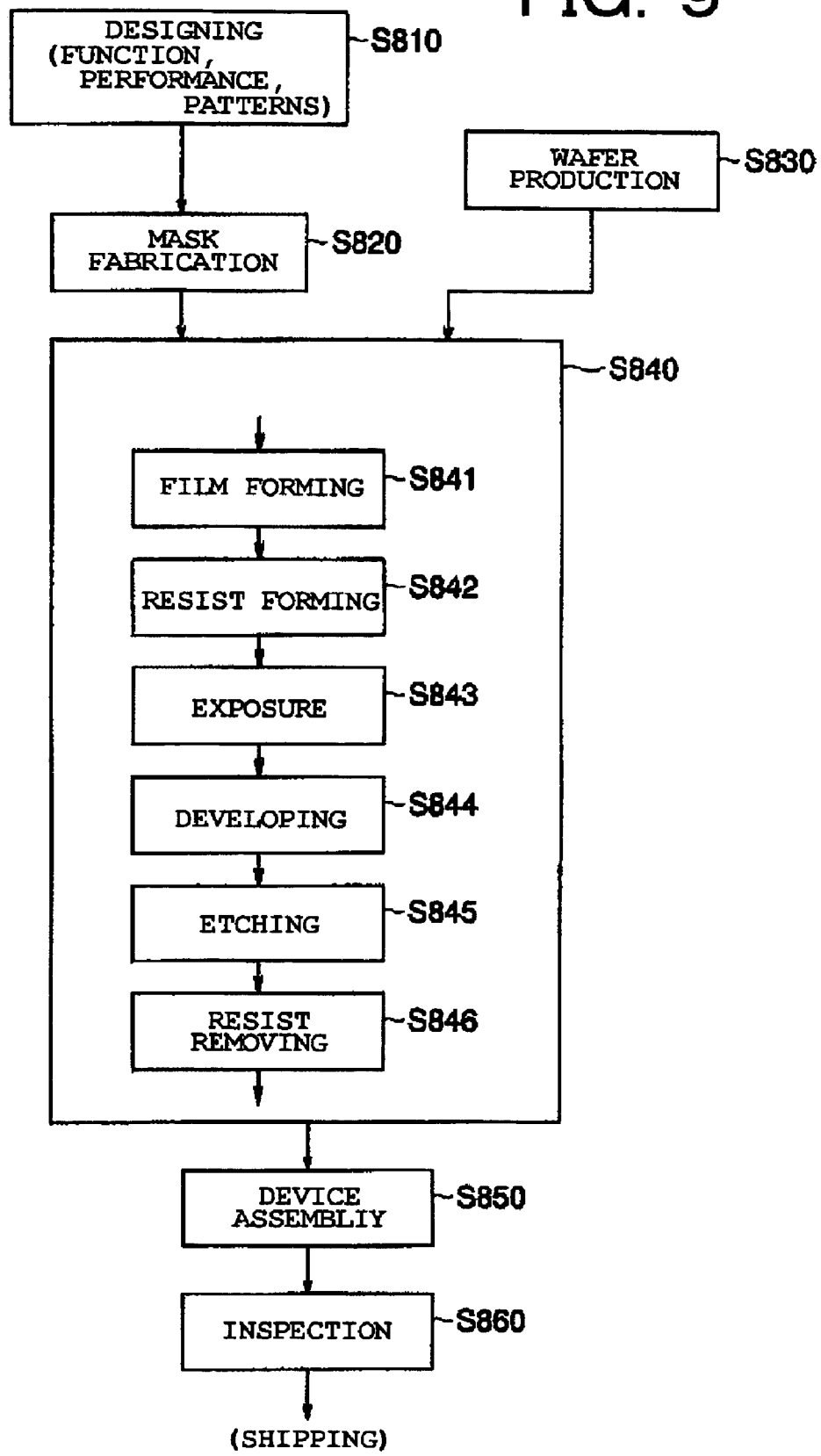
FIG. 9 is a flow chart of the process of production of an electronic device.

FIG. 9 is a flow chart showing the process of production of for example an IC or LSI or other semiconductor chip, liquid crystal panel, CCD, thin film magnetic head, micromachine, or other electronic device. As shown in FIG. 9, in the process of production of an electronic device, first the circuits of the electronic device are designed and the functions and performance of the device are otherwise designed, then the patterns for realizing the functions are designed (S810), Next, a mask forming the designed circuit patterns is fabricated (S820). On the other hand, silicon or another material is used to produce a process (device manufacturing) wafer (silicon substrate) (S830).

Next, the mask fabricated at S820 and the process wafer produced at S830 are used for forming actual circuits etc. on the process wafer by lithography etc. (S840). Specifically, first, the process wafer is formed on its surface with an insulating film, electrode interconnect film, semiconductor film, or other thin film (S841), then the entire surface of the thin film is coated with a photosensitizer (resist) using a coater (S842). Next, this resist-coated substrate is loaded on a wafer holder of the exposure apparatus, the mask produced at S830 is loaded on the reticle stage, and the patterns formed on the mask are reduced and transferred to the process wafer (S843). At this time, the exposure apparatus successively positions each shot area of the process wafer at the exposure position and successively transfers the patterns of the mask at each shot area in accordance with the shot array coordinates found by EGA calculation and computation based on the optimal alignment parameters determined by the alignment simulator according to the present invention.

After the exposure is finished, the process wafer is unloaded from the wafer holder and developed using a developer (S844). Due to this, the process wafer is formed on its surface with resist images of the mask patterns. Further, the finished developed process wafer is etched by an etching system (S845) and the resist remaining on the process wafer surface is removed using for example a plasma ashing system etc. (S846).

Due to this, each shot area of the process wafer is formed with an insulation layer, electrode interconnects, or other patterns. This processing is successively repeated while changing the masks to form the actual circuits etc. on the process wafer. After the process wafer is formed with circuits etc., the devices are assembled (S850). Specifically, the process wafer is diced into the individual chips, the individual chips are fit into lead frames or packages and electrodes are connected by bonding, and the results are resin sealed etc. for packaging. Further, the produced devices are tested to confirm their operation, tested for durability, and otherwise inspected (S860) and the devices are shipped out as completed products.

Note that the embodiment explained above was described for facilitating understanding of the present invention and was not described for limiting the present invention. Therefore, the elements disclosed in the above embodiment include all design modifications and equivalents falling in the technical scope of the present invention.

For example, the above embodiment was explained with reference to an exposure apparatus comprised of a step-and-repeat type exposure apparatus, but the invention may also be applied to a step-and-scan type exposure apparatus. Further, the invention is not limited to an exposure apparatus used for production of semiconductor devices or liquid crystal display elements and may also be applied to an exposure apparatus used in the production of plasma displays, thin film magnetic heads, and image capturing devices (CCDs etc.) or an exposure apparatus for transferring circuit patterns to a glass substrate or silicon wafer for producing a reticle or mask. That is, the present invention can be applied without regard as to the exposure apparatus or application of the exposure apparatus.

Further, the exposure use illumination light (energy beam) used in the exposure apparatus is not limited to ultraviolet light and may also be X-rays (including EUV light), an electron beam, ion beam, or other charged particle beam etc. Further, the exposure apparatus may also be used for producing a DNA chip, mask, reticle, etc.

Further, in the above embodiment, the present invention was explained with reference to the case of application to an exposure system, but the present invention can also be applied to a conveyor apparatus, measurement system, inspection system, test system, or any other system for positioning an object or a workpiece.

The present disclosure is related to matter included in Japanese Patent Application No. 2004-105941 filed on Mar. 31, 2004, the entire disclosure of which is clearly incorporated by reference.

The invention claimed is:

1. A method for determining alignment parameters for positioning each of a plurality of processing areas arrayed on an object with respect to a predetermined processing position, which method for determining the alignment parameters comprises
a first step of performing position measurement for any sample points set in each processing area under predetermined alignment parameters through opto-electric detection and statistical processing based on measured positions and design positions of said sample points to obtain reference computation results,
a second step of positioning and processing each processing area at said predetermined processing position based on said reference computation results, then measuring a first processing error of said processing area to obtain reference processing results,
a third step of changing at least part of said predetermined alignment parameters and performing position measurement of any sample points set in each processing areas and statistical processing based on the measured positions and design positions of said sample points to obtain comparative computation results, and
a fourth step of calculating a second processing error for each processing area, estimated when assuming said positioning and processing said processing area at said predetermined processing position based on said comparative computation results, using said reference computation results, said comparative computation results, and said reference processing results,
wherein said third step includes:
a sixth step of using signal waveforms obtained by said opto-electric detection at said first step to change at least part of said predetermined alignment parameters and obtain a plurality of said comparative computation results and
a seventh step of comparing the plurality of comparative computation results obtained at said sixth step and said reference computation results and selecting candidates of said comparative computation results to be used in said fourth step based only on said comparison results.

2. The method for determining alignment parameters as set forth in claim 1, further comprising,
in said third step, changing the alignment parameters in a plurality of ways to obtain a plurality of comparative computation results,
in said fourth step, converting said reference processing results based on the differences between said reference computation results and said comparative computation results to calculate a plurality of estimated processing errors, and
a fifth step of comparing the plurality of estimated processing errors calculated at said fourth step and said reference processing result to obtain a comparison result and determining said alignment parameters based on the comparison results.

3. The method for determining alignment parameters as set forth in claim 2, further comprising, in said fifth step, determining the optimal alignment parameters based on at least one of the average value and standard error of the processing error for each processing area according to said reference processing result or said estimated processing error.

4. The method for determining alignment parameters as set forth in claim 1, further comprising, in said third step, changing variable first alignment parameters of any sample point among said alignment parameters without requiring repeat opto-electric detection so as to calculate said comparative computation results.

5. The method for determining alignment parameters as set forth in claim 4, wherein said first alignment parameters include at least one of the combination used in sample points opto-electrically detected at said first step, the processing parameters of the signal waveforms obtained by the opto-electric detection at said first step, the statistical processing model used at the time of said statistical processing, and the amounts of correction to be added to the measurement positions of the sample points opto-electrically detected at said first step.

6. The method for determining alignment parameters as set forth in claim 1, further comprising, in said third step, changing second alignment parameters, among said alignment parameters, requiring repeat opto-electric detection of said sample points separate from the opto-electric detection at said first step so as to calculate said comparative computation results.

7. The method for determining alignment parameters as set forth in claim 6, wherein said second alignment parameters include at least the type, number, and layout of said sample points, illumination parameters for illuminating said sample points at the time of said opto-electric detection, the state of focus at the time of said opto-electric detection, and the type of alignment sensor performing said opto-electric detection.

8. An exposure method for exposing and transferring patterns of a mask on a plurality of shot areas arrayed on a substrate, said exposure method comprising:
   performing position measurement for sample points set in each shot area serving as a processing area by opto-electric detection using optimal alignment parameters determined by a method of determination of alignment parameters including:
      a first step of performing position measurement for any sample points set in each processing area under predetermined alignment parameters through opto-electric detection and statistical processing based on measured positions and design positions of the sample points to obtain reference computation results;
      a second step of positioning and processing each processing area at the predetermined processing position based on the reference computation results, then measuring a first processing error of the processing area to obtain reference processing results;
      a third step of changing at least part of the predetermined alignment parameters and performing position measurement of any sample points set in each processing areas and statistical processing based on the measured positions and design positions of the sample points to obtain comparative computation results; and
      a fourth step of calculating a second processing error for each processing area, estimated when assuming the positioning and processing the processing area at the predetermined processing position based on the comparative computation results, using the reference computation results, the comparative computation results, and the reference processing results;
      wherein said third step includes:
         a sixth step of using signal waveforms obtained by said opto-electric detection at said first step to change at least part of said predetermined alignment parameters and obtain a plurality of said comparative computation results and
         a seventh step of comparing the plurality of comparative computation results obtained at said sixth step and said reference computation results and selecting candidates of said comparative computation results to be used in said fourth step based only on said comparison results; and
   performing statistical processing based on measured positions and design positions of said sample points and successively positions said shot areas with respect to an exposure apparatus serving as said predetermined processing position and exposes each shot area based on the computation results.

9. An apparatus for determining alignment parameters for positioning a plurality of processing areas arrayed on an object with respect to a predetermined processing position,
   said apparatus for determining alignment parameters having
   a reference computation result fetching means for performing position measurement for any sample points set in each said processing area under predetermined alignment parameters via opto-electric detection and statistical processing based on measured positions and design positions of said sample points to obtain reference computation results,
   a reference processing result fetching means for measuring a first processing error for each processing area to obtain reference processing results after positioning and processing said processing area at said predetermined processing position based on said reference computation results,
   a comparative computation result fetching means for changing at least part of said predetermined alignment parameters and performing position measurement of any sample points set for each said processing area and statistical processing based on measured positions and design positions of said sample points to obtain comparative computation results; and
   a processing error calculating means for calculating a second processing error for said processing areas estimated when assuming positioning and processing said processing areas at said predetermined processing position based on said comparative computation results using said reference computation results, said comparative computation results, and said reference processing results;
   wherein said comparative computation result fetching means includes:
      a plurality of said comparative computation result fetching means for using signal waveforms obtained by said opto-electric detection performed by said reference computation result fetching means, changing at least part of said predetermined alignment parameters to obtain a plurality of said comparative computation results, and
      a comparative computation result comparing means for comparing the plurality of comparative computation results obtained by said plurality of said comparative computation result fetching means and selecting candidates of said comparative computation results based on residual error components of said comparative computation results to be used in a processing error calculating means based only on said comparison results.

10. The apparatus for determining alignment parameters as set forth in claim 9, wherein
   said comparative computation result fetching means changes said alignment parameters in a plurality of ways to obtain a plurality of said comparative computation results,
   said processing error calculating means converts said reference processing results and calculates said estimated processing error based on the differences between said reference computation results and said comparative computation results, and
   further comprising a parameter determining means for comparing the plurality of estimated processing error calculated by said processing error calculating means and said reference processing result and determining said alignment parameters based on the comparison results.

11. An exposure apparatus for transferring by exposure patterns of a mask on a plurality of shot areas arrayed on a substrate, said exposure apparatus provided with the apparatus for determining alignment parameters according to claim 10, performing position measurement for any sample points set for each shot area serving as a processing area by opto-electric detection using optimal alignment parameters determined by the apparatus for determination of the alignment parameters and statistical processing based on measured positions and design positions of said sample points, and successively positioning said shot areas with respect to said exposure apparatus serving as said predetermined processing position and exposing each shot area based on the obtained computation results.

12. The exposure apparatus as set forth in claim 11, wherein said apparatus uses as an object a device production substrate to which device patterns formed on said mask transferred by exposure, said comparative computation result fetching means performs said position measurement and statistical processing for said device production substrate while changing said alignment parameters in a plurality of ways to obtain a plurality of said comparative computation results, and said apparatus for determining alignment parameters compares said plurality of comparative computation results and said reference computation results and determines said alignment parameters based on said comparison results.

13. The exposure apparatus as set forth in claim 12, wherein said apparatus for determining alignment parameters determines said alignment parameters based on random residual error components of said comparative computation results.

14. The exposure apparatus as set forth in claim 13, which, when said random residual error component exceeds a predetermined allowable value, excludes said device production substrate from the substrates for transfer of said device patterns by exposure or makes said comparative computation result fetching means change said alignment parameters for said position measurement and statistical processing.

* * * * *